United States Patent
Horiguchi et al.

(10) Patent No.: US 6,870,790 B2
(45) Date of Patent: Mar. 22, 2005

(54) SEMICONDUCTOR DEVICE HAVING A POWER DOWN MODE

(75) Inventors: Masashi Horiguchi, Kawasaki (JP);
Masayuki Nakamura, Ome (JP);
Sadayuki Ohkuma, Hidaka (JP);
Kazuhiko Kajigaya, Iruma (JP);
Yoshinobu Nakagome, Hamura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/724,781

(22) Filed: Dec. 2, 2003

(65) Prior Publication Data

US 2004/0109383 A1 Jun. 10, 2004

Related U.S. Application Data

(62) Division of application No. 10/259,579, filed on Sep. 30, 2002, now Pat. No. 6,680,875, which is a division of application No. 09/759,244, filed on Jan. 16, 2001, now abandoned, which is a continuation of application No. 09/289,660, filed on Apr. 12, 1999, now Pat. No. 6,195,306.

(30) Foreign Application Priority Data

Apr. 10, 1998 (JP) ............................................. 10-98694

(51) Int. Cl.[7] .................................................. G11C 8/00
(52) U.S. Cl. ......................... 365/233; 365/226; 365/227
(58) Field of Search ............................... 365/233, 226, 365/227

(56) References Cited

U.S. PATENT DOCUMENTS

| 5,463,588 A | | 10/1995 | Chonan |
| 5,659,519 A | | 8/1997 | Lee et al. |
| 5,781,494 A | | 7/1998 | Bae et al. |
| 5,804,893 A | * | 9/1998 | Fujioka ...................... 307/125 |
| 5,877,652 A | * | 3/1999 | Oh ............................. 327/546 |

FOREIGN PATENT DOCUMENTS

JP          9-161481          6/1997

* cited by examiner

Primary Examiner—Hoai Ho
(74) Attorney, Agent, or Firm—Antonelli, Terry, Stout & Kraus, LLP

(57) ABSTRACT

A synchronous DRAM is provided which includes arrangements for operations of power supply circuitry based upon whether the DRAM is in a power down mode or not. In one embodiment, a first power supply circuit and a second power supply circuit are provided which both receive externally supplied voltages and output internal supply voltages. The first power supply circuit is not in operation when a semiconductor device of the synchronous DRAM is in a power down mode. However, the second power supply circuit is continuously in operation during the power down mode. In another arrangement, the operation of a voltage limiter circuit is controlled based on whether or not the DRAM is in a power down mode.

8 Claims, 27 Drawing Sheets

(SELF-REFRESH MODE)

SEMICONDUCTOR DEVICE HAVING A POWER DOWN MODE

CROSS-REFERENCE TO RELATED APPLICATION

This application is a divisional of Ser. No. 10/259,579, filed Sep. 30, 2002 now U.S. Pat. No. 6,680,875, which is a divisional of application Ser. No. 09/759,244, filed Jan. 16, 2001 now abandoned; which is a continuation of Ser. No. 09/289,660, filed Apr. 12, 1999 (now U.S. Pat. No. 6,195,306), the entire disclosures of which are hereby incorporated by reference.

BACKGROUND OF THE INVENTION

The present invention relates to power supply circuits of a semiconductor memory and, more specifically, to a control method for achieving low power dissipation.

In this specification, reference will be made to the following publications: Japanese Patent Laid-Open No. 105682/1995 (called the Cited Reference 1; corresponding to U.S. Pat. No. 5,463,588), and Japanese Patent Laid-Open No. 161481/1997 (called the Cited Reference 2).

Semiconductor memories extensively utilize what is known as an on-chip voltage limiter method (i.e., power-down method) whereby the semiconductor chip lowers an externally supplied voltage to generate an internal voltage for use as a power supply. The method is used to reduce power dissipation of circuits or to improve reliability of fine elements in the device. In achieving such objects, voltage limiter circuits (power-down circuits) are utilized to generate the internal supply voltage.

A voltage limiter circuit consumes a steady current so as to maintain an output voltage level even when the semiconductor memory is in standby mode. As a way to reduce power dissipation in the standby state, the Cited Reference 1 proposes a total of eight voltage limiter circuits, i.e., two limiter circuits furnished to each of four memory cell, arrays; and a single, common voltage limiter circuit that is common to all memory cell arrays (FIG. 3 in the Cited Reference 1). The common voltage limiter circuit is constantly in operation. The eight voltage limiter circuits start operating simultaneously when the memory is accessed, and four of the circuits are allowed to remain active upon elapse of a predetermined period of time following the start of the access.

The Cited Reference 2 discloses first and second voltage limiters furnished corresponding to respective first and a second banks, along with a description of operation timings of the limiters. When the first bank is ordered to be activated, the first voltage limiter generates an internal voltage. If the second bank is ordered to be activated while the first bank is still active, the second voltage limiter also generates an internal voltage in cooperation with the first Voltage limiter (FIG. 12 of the Cited Reference 2).

SUMMARY OF THE INVENTION

The inventors of the present invention have studied the power dissipation of SDRAMs (synchronous dynamic random access memories) in active standby mode. The active standby mode of the SDRAM is a mode in which a memory bank is left active to retain one-word data in sense amplifiers in preparation for memory access, with a read or a write command yet to be issued. Whereas it takes a relatively long time to read data from dynamic memory cells, the data, once placed in sense amplifiers, may be read at high speed because the data thus retained are handled as if they were in a column of an SRAM (static random access memory).

Active standby mode is entered when a bank active command is applied. The application of the bank active command selects a word line and operates sense amplifiers, thus causing a large current to flow. Then with no further command issued, no power dissipation should occur in theory. In practice, where a voltage limiter circuit is included, a current flows to that circuit. If both standby and operating voltage limiter circuits operate, they dissipate a fairly large current (generally of several to tens of mA). In particular, many synchronous DRAMs are arranged to leave their banks active to take advantage of the high-speed data transmission feature. This means that an active standby current can have a significant effect on the power dissipation of the system as a whole.

In the disclosure of the Cited Reference 1, bank-related operations specific to SDRAMs are not considered. No technique is disclosed in connection with controlling the driving capability of voltage limiters in units of a plurality of memory arrays, memory blocks or banks. The inventors of this invention found that if the techniques of the Cited Reference 1 were applied to SDRAMs, as many as eight voltage limiter circuits (nine if a common voltage limiter circuit is included) would operate simultaneously in the initial stage of an active period, causing an excessively large operation current to flow at peak time. With the initial stage ended and with the active period still in effect, four voltage limiter circuits (five if the common voltage limiter circuit is included) would be in operation. This, the inventors found, will give rise to an unnecessarily high level of power dissipation during the active period.

The Cited Reference 2 does not take the active standby mode of SDRAMs into consideration. The inventors of this invention found that successively activating a plurality of memory banks in the SDRAM would cause a growing number of the corresponding voltage limiter circuits to become active; and putting a plurality of memory banks in active standby mode would unnecessarily add up operation currents of the corresponding limiter circuits. The increase of such operation currents can become a serious problem if a large number of banks are involved.

It is therefore an object of the present invention to overcome the above-described drawbacks and disadvantages and to provide a semiconductor device comprising: first and second memory banks activated by first and second commands (first and second control signals) respectively; a power supply line for supplying a predetermined voltage to the first and the second memory banks; and first and second power supply circuits (first and second voltage generating circuits) having respective output nodes connected to the power supply line, the first and the second power supply circuits generating the predetermined voltage; wherein the first power supply circuit starts generating the predetermined voltage in response to the first command; and wherein, upon input of the second command with the first memory bank left active, the first power supply circuit stops generating the predetermined voltage in response to the second command while the second power supply circuit starts generating the predetermined voltage in response to the second command.

Other objects, features and advantages of the invention will become more apparent upon a reading of the following description taken with reference to the appended drawings.

DESCRIPTION OF THE PREFERRED EMBODIMENTS

Preferred embodiments of this invention will now be described with reference to the accompanying drawings. Circuit elements constituting each of the blocks making up the embodiments are formed, but not limited, by known integrated circuit techniques such as those of CMOS (complementary MOS) transistors on a single semiconductor substrate made illustratively of single crystal silicon. Of the circuit symbols representing MOSFETs or MISFETs (metal insulation semiconductor FETs), those not arrowed denote N-type MOSFETs (NMOSs) and those arrowed stand for P-type MOSFETs (PMOSs).

First Embodiment

Figure 1:
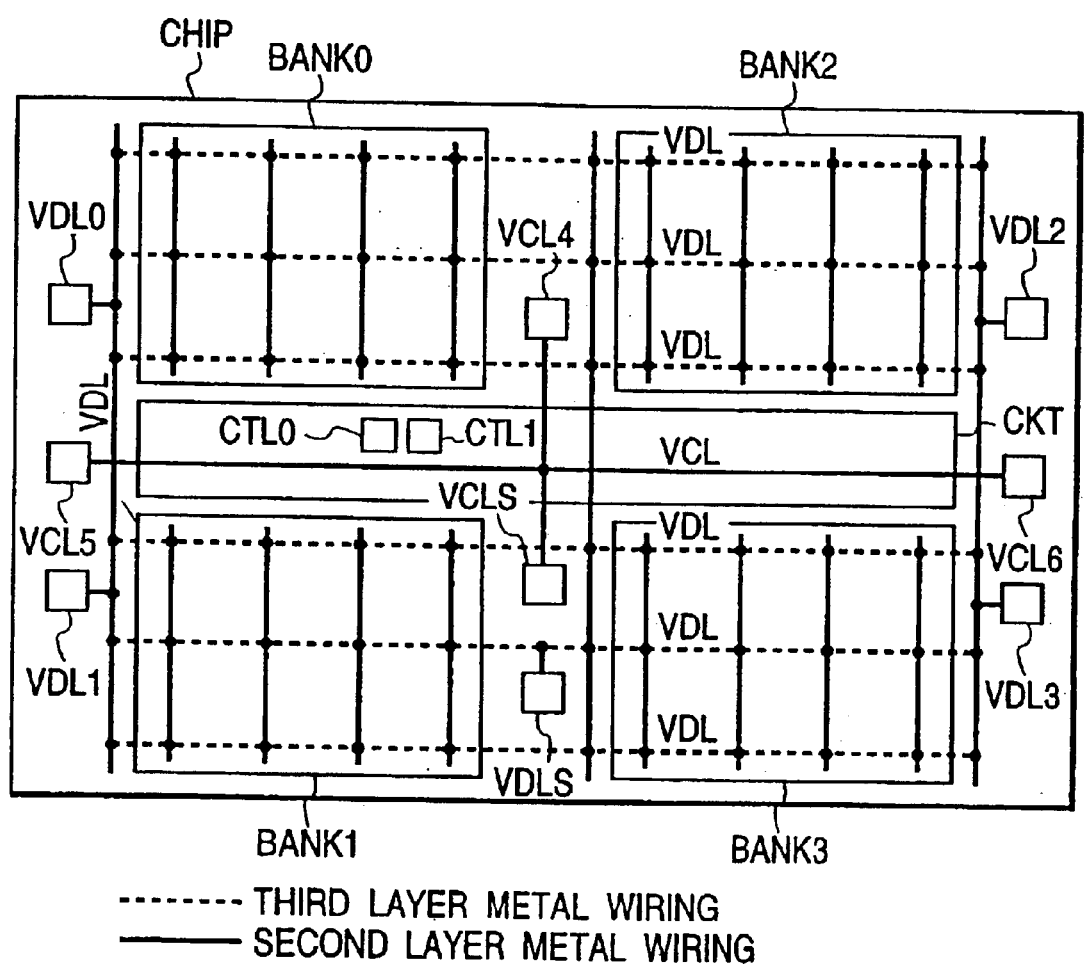
FIG. 1 is a schematic view of a synchronous DRAM practiced as a first embodiment of this invention.

FIG. 1 shows a four-bank synchronous DRAM embodying the invention. In FIG. 1, CHIP stands for a semiconductor memory chip; BANK0 through BANK3 denote the memory banks; CKT represents peripheral circuits common to all banks; VDL0 through VDL3 and VDLS indicate voltage limiter circuits (power-down circuits; more commonly, power supply circuits) for generating an internal supply voltage VDL (first internal voltage) for use by memory arrays from an externally supplied voltage VDD; and VCL4 through VCL6 and VCLS denote voltage limiter circuits (voltage generating circuits) for generating an internal supply voltage VCL (second internal voltage) for use by peripheral circuits from the voltage VDD. Illustratively, the voltages VDD, VCL and VDL are 3.3 V1 2.2 V and 1.8 V respectively. The internal circuits are supplied with the two internal voltages VCL and VDL which are derived from the externally supplied voltage VDD and which are lower than the voltage VDD. The voltage VDL is kept lower than the voltage VCL.

The control circuit CTL0 controls the circuits VDL0 through VDL3, and the control circuit CTL1 controls the circuits VCL4 through VCL6. The circuits CTL0 and CTL1 are included in the peripheral circuits CKT. The circuits CKT further comprise bonding pads, input buffers, output buffers, a main control circuit (to be described later), a main amplifier and a refresh counter. The input and output buffers operate on, but are not limited by, the externally supplied voltage VDD.

Figure 2:
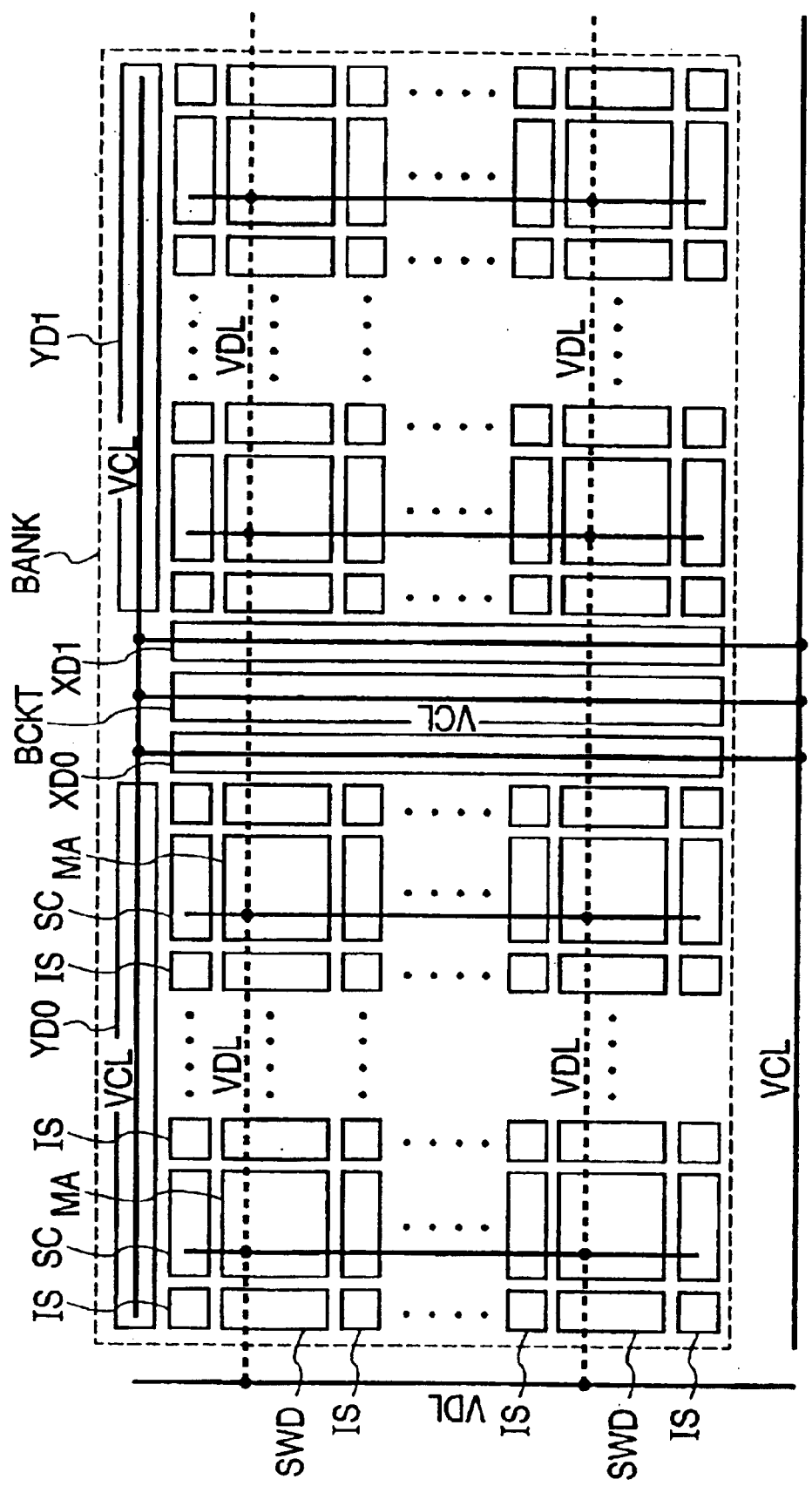
FIG. 2 is a diagram of a bank as part of the synchronous DRAM in FIG. 1.

FIG. 2 shows a typical bank structure. In FIG. 2, MA denotes a memory array in which memory cells are arranged in a matrix fashion; SC stands for a sense circuit; SWD represents a sub-word line driver; and IS indicates an intersection region where the sense circuit and the sub-word line driver intersect. The region IS includes a sense amplifier driving circuit, as will be described later.

The first internal voltage VDL is used to power the sense amplifier driving circuit. To reduce parasitic resistance, the VDL line is composed of a second and a third metal layers arranged in a mesh manner. As depicted in FIG. 1, the VDL line is furnished across the memory banks BANK0 through BANK3. That is, the VDL line is provided commonly to BANK0 through BANK3. The voltage VDL is also supplied to a VDL/2 generating circuit, not shown, which generates half the voltage VDL. As will be described later, the voltage VDL/2 is used to precharge plate electrodes and bit lines of the memory cells.

The second internal voltage VCL is supplied to row decoders XD0 and XD1, column decoders YD0 and YD1, bank-dedicated peripheral circuits BCKT, and common peripheral circuits CKT. The bank-dedicated peripheral circuits BCKT include an address latch and a pre-decoder. Because the row decoders, column decoders and peripheral circuits BCKT and CKT operate on the voltage VCL, the VCL line passes through these circuits. As shown in FIG. 1, the VCL line is also furnished across the memory banks BANK0 through BANK3. Whereas the input and output buffers included in the common peripheral circuits CKT operate on the voltage VDD, as will be described earlier, the majority of the other circuits in the common peripheral circuits CKT operate on the voltage VCL that is lower than the voltage VDD so as to achieve low power dissipation. Illustratively, the main control circuit, main amplifier, refresh counter, and control circuits CTL0 and CTL1 operate on the voltage VCL as well.

Figure 3:
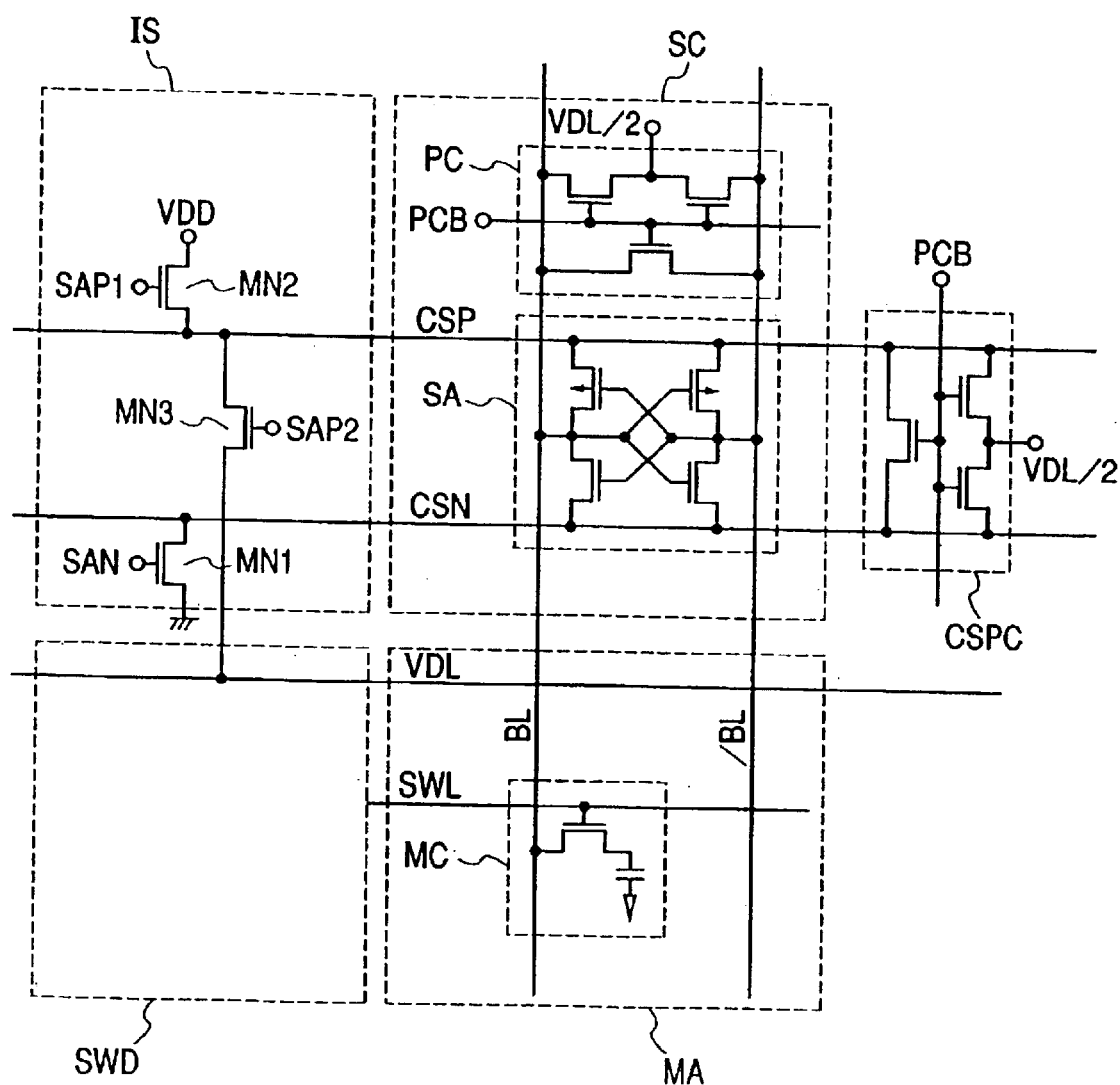
FIG. 3 is a detailed circuit diagram of part of the bank in FIG. 2.

FIG. 3 depicts details of a memory array MA, a sense circuit SC and a sense amplifier driving circuit IS. At an intersection between a sub-word line SWL and a bit line pair BL and /BL is a dynamic memory cell MC furnished in a known folded data line pair fashion, the memory cell comprising a capacitor connected to a source-drain path of a switch MOSFET. The other end of the capacity is a plate electrode supplied commonly with the voltage VDL/2. The sense circuit SC comprises a sense amplifier SA (made of two cross-connected CMOS inverters) for amplifying a signal voltage on the bit line pair, and a bit line precharging circuit PC for precharging the bit line pair to half the voltage VDL. Paired signal lines CSN and CSP for driving the sense amplifier SA are wired up to the sense amplifier driving circuit. A precharging circuit CSPC similar to the bit line precharging circuit is furnished between the signal lines CSN and CSP and is supplied with the voltage VDL/2. The sense amplifier driving circuit IS comprises three MOS transistors MN1 through MN3.

When not in amplifying operation, the signal lines CSN and CSP are precharged by the precharging circuit CSPC to half the voltage VDL. An amplifying operation is started by initially turning on the transistors MN1 and MN2. This connects the signal line CSN to ground and the signal line CSP to the external power supply VDD, causing the line CSN to drop and the line CSP to rise in potential. When the potential of the line CSP is raised close to the VDL level, the MOS transistor MN2 is turned off and the MOS transistor MN3 is turned on. The activated and deactivated transistors connect the line CSP to the internal power supply VDL. Eventually, the lines CSN and CSP reach 0 V and the voltage VDL respectively. This completes the amplifying operation, with one of the paired bit lines on the 0 V level and the other on the VDL level. The purpose of connecting the line CSP initially to the voltage VDD instead of directly to the voltage VDL is twofold: to make the amplifying operation faster, and to ease burdens on the VDL voltage limiter circuit. The technique is known as overdrive.

Figure 4:
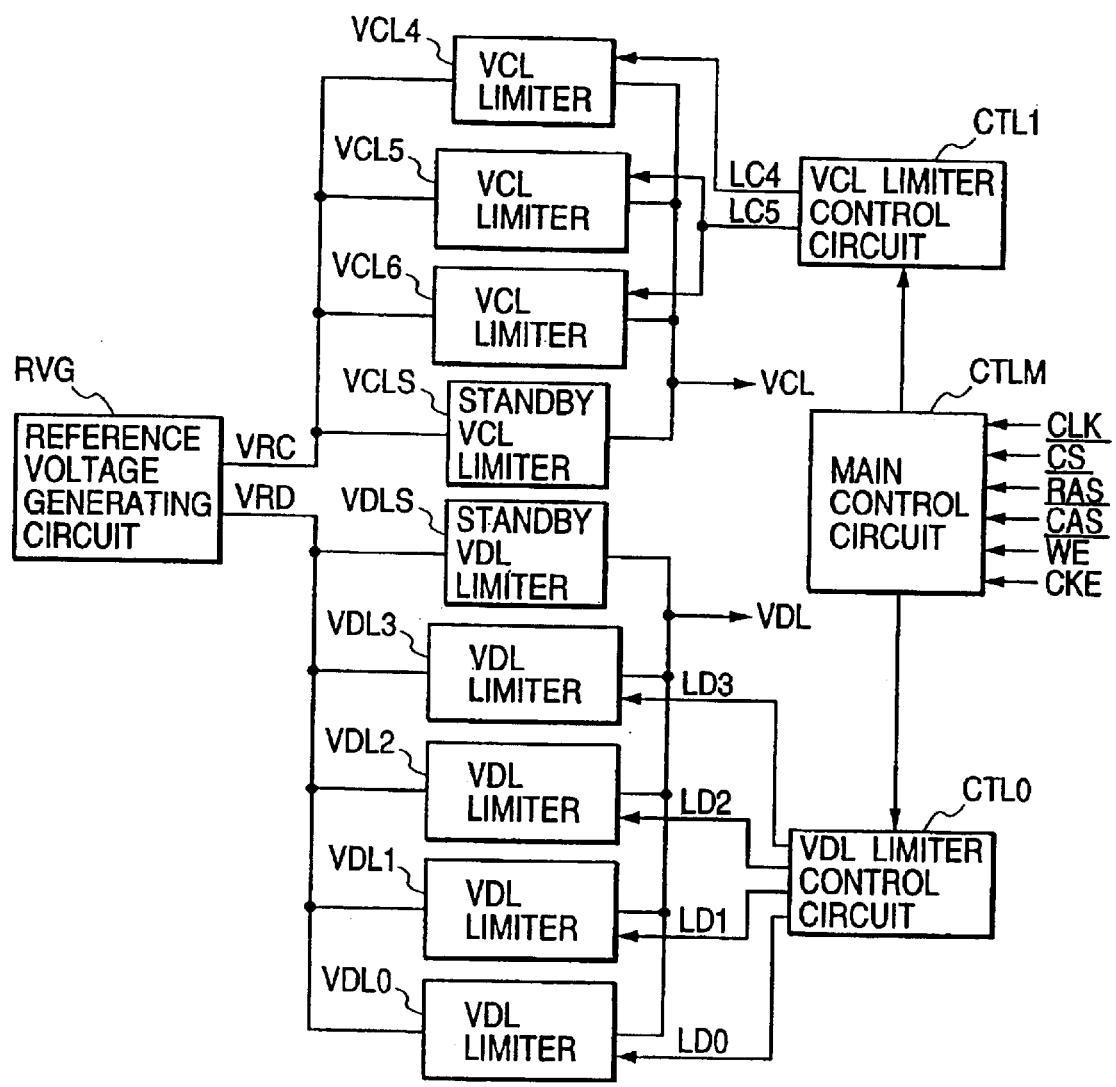
FIG. 4 is a block diagram of power supply circuits in the synchronous DRAM of FIG. 1.

FIG. 4 shows connecting relations between power supply circuits of the first embodiment. The voltage limiter circuits VDL0 through VDL3 and VDLS generate the first internal voltage VDL by referring to a reference voltage VRD generated by a reference voltage generating circuit RVG (not shown in FIG. 1). The circuit VDLS is continuously in operation. Because its current supplying capacity is small, the circuit VDLS consumes a low level of power. The circuits VDL0 through VDL3 consume relatively high levels of power, have enhanced current supplying capacities, and are turned on and off by active signals LD0 through LD3 generated by the control circuit CTL0. In FIG. 4, the sizes of the blocks representing the limiter circuits denote proportionally their current supplying capacities. The outputs of the circuits VDL0 through VDL3 and VDLS are connected to the second layer metal line (indicated by solid lines in FIGS. 1 and 2) and the third layer metal line (denoted by dotted lines in FIGS. 1 and 2) arranged perpendicular to one another.

The voltage limiter circuits VCL4 through VCL6 and VCLS generate the second internal voltage VCL by referring to a reference voltage VRC generated by the reference voltage generating circuit RVG. The circuit VCLS is continuously in operation. Because its current supplying capacity is small, the circuit VCLS consumes a low level of power. The circuits VCL4 through VCL6 consume relatively high levels of power and have enhanced current supplying capacities. The voltage limiter circuit VCL4 is turned on and off by an active signal LC4 generated by the control circuit CTL1, and the circuits VCL5 and VCL6 are activated and deactivated by an active signal LC5 generated by the circuit CTL1. The outputs of the circuits VCL4 through VCL6 and VCLS are interconnected.

The main control circuit CTLM (not shown in FIG. 1) receives a clock signal CLK, a chip select signal /CS (a slash "/" prefixed to a signal name signifies that the signal is a complementary signal that is enabled when brought Low), a row address strobe signal/RAS, a column address strobe signal/CAS, a write enable signal/WE, and a clock enable signal CKE; it interprets commands; and it establishes operation modes accordingly. Synchronous DRAMs have a standardized method for designating commands through the combination of such signals as /CS, /RAS, /CAS, /WE and CKE in effect at a leading edge of the clock signal CLK. The first embodiment of this invention obeys the standardized method.

The first embodiment is characterized roughly by two features. That is, the outputs of a plurality of voltage limiter circuits are interconnected, and the circuits are turned on and off individually depending on the operation mode the memory is in as described below.

The control circuit CTL0 will now be described with reference to the circuit diagram of FIG. 5 as well as the operation waveform charts of FIG. 6 and FIG. 7. Input signals BA0 through BA3 are bank active signals (control signals). Each of the signals is set to "1" when activating the corresponding memory bank (one of banks 0 through 3). and to "0" when deactivating it. A bank active command ACTV standardized for SDRAMs is designated by use of /CS=L, /RAS=L, /CAS=H, /WE=H, a row address (to designate a word line), and a bank address (to designate a bank number). More commonly, a bank is activated (i.e., selected) by first designating the bank location and one word in the bank. The one-word data are then read out to a plurality of corresponding sense amplifiers and latched. RF represents a refresh signal that is set to "1" when refreshing the memory. As described above, the output signals LD0 through LD3 turn on and off the VDL limiter circuits VDL0 through VDL3 respectively (set to "1" for circuit activation and "0" for deactivation).

Figure 5:
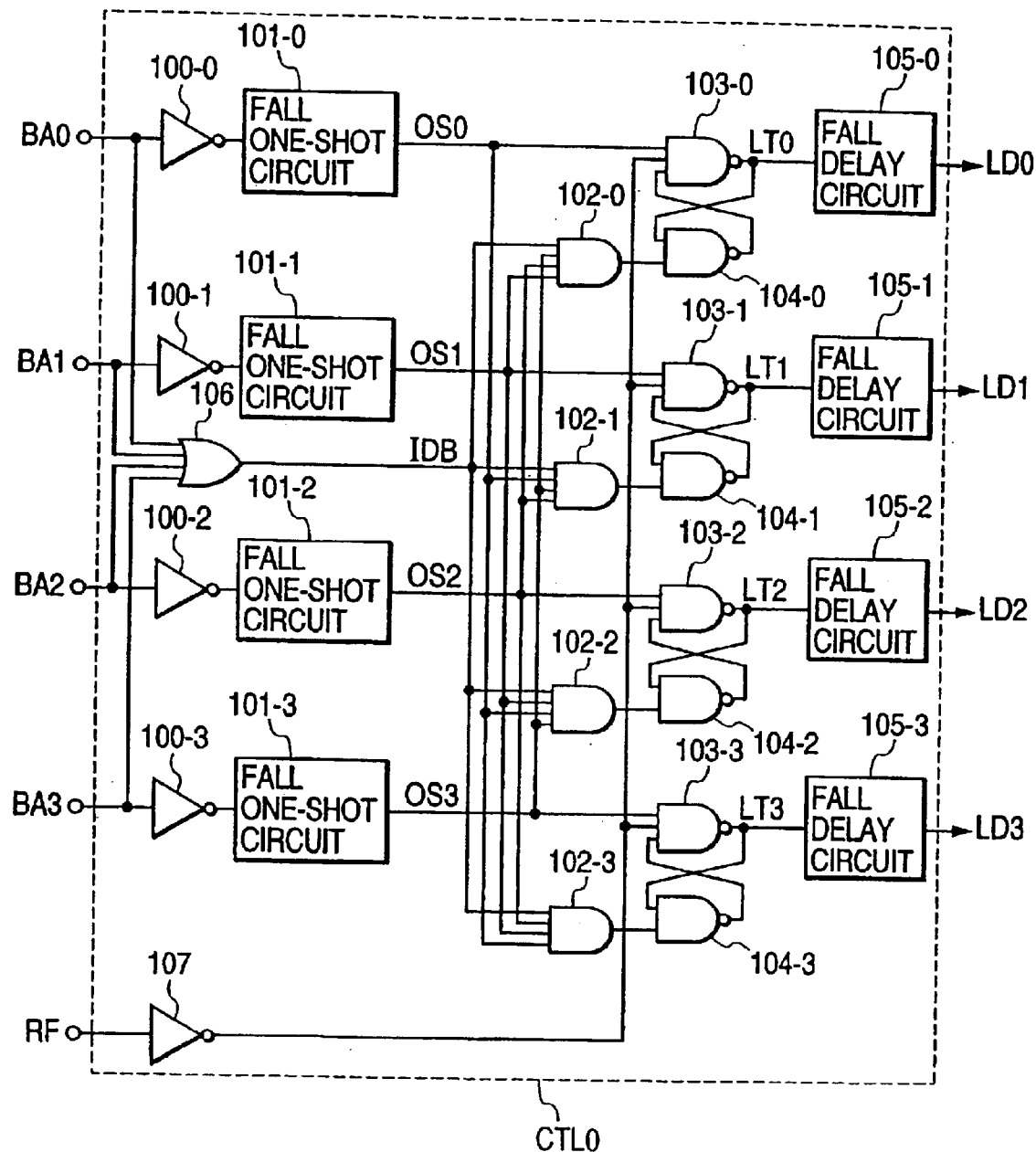
FIG. 5 is a circuit diagram of a voltage limiter control circuit CTL0 in the synchronous DRAM of FIG. 1.
Figure 6:
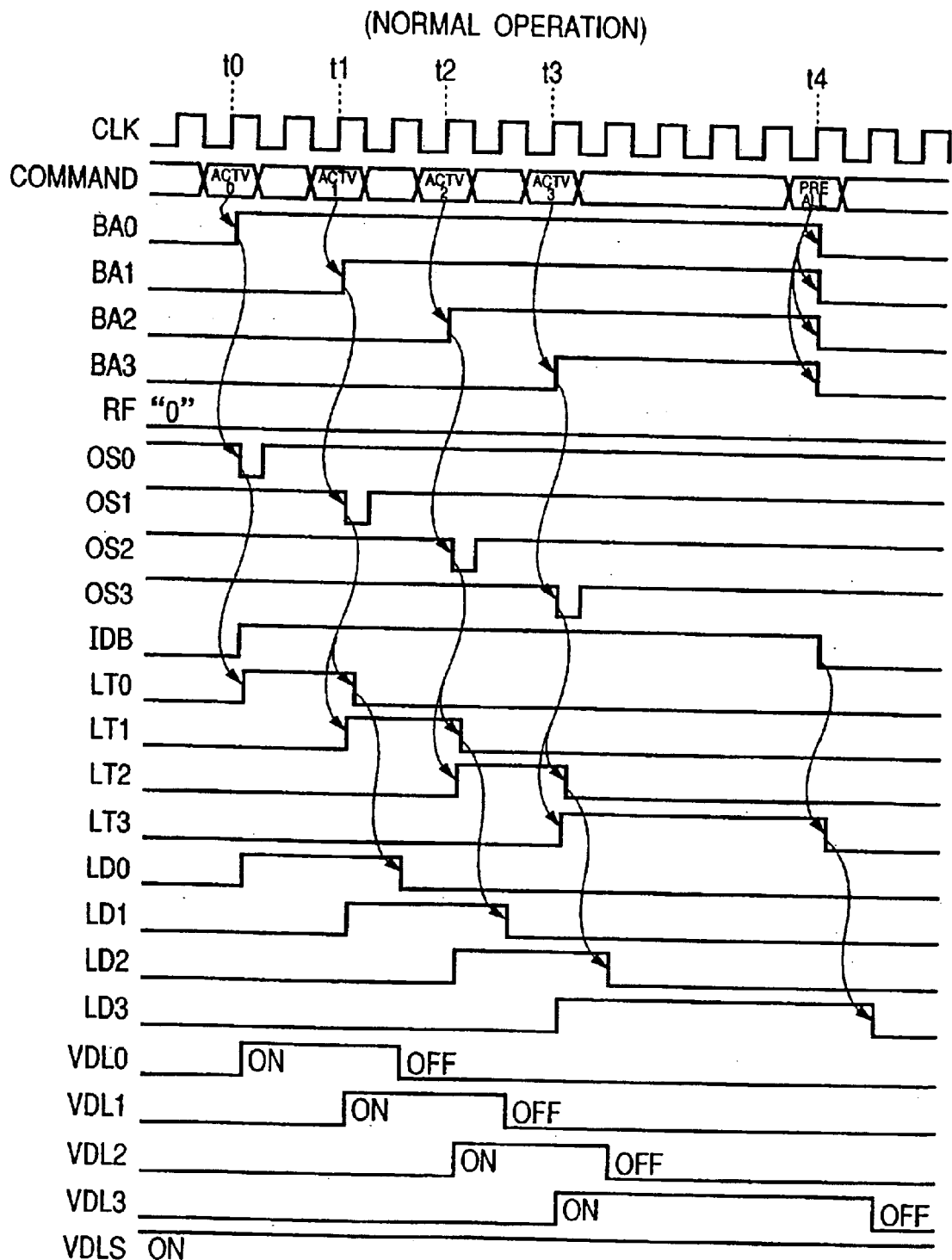
FIG. 6 is an operation waveform chart applicable to the control circuit in FIG. 5.

FIG. 6 is an operation. waveform chart applicable to the control circuit of FIG. 5 in normal operation. At times t0, t1 t2 and t3, commands for activating banks 0 through 3 (ACTV0 through ACTV3) are input respectively. At time t4, an all-bank precharge command (PRE ALL) is input. When the command PRE ALL is input, all banks are deactivated, and the paired data lines and paired sense amplifier driving lines of each bank are precharged to the voltage VDL/2. Although it is common practice to input a read or a write command between the activation of a bank and a precharging operation, the command input is omitted here for purpose of simplification. When the input signal BA0 reaches "1," an inverter 100-0 and a one-shot pulse generator 101-0 act to set a signal OS0 to "0" for a predetermined period of time. This causes a latch made of NAND gates 103-0 and 104-0 to yield an output LT0 of "1," and the output signal LD0 is set to "1." When the input signal BA1 becomes "1," a signal OS1 is set to "0" for a predetermined period of time. This causes a latch made of NAND gates 103-1 and 104-1 to provide an output LT1 of "1," and the output LT0 is set to "0." The output signal LD1 becomes "1," and the output signal LD0 reaches "0" after a predetermined delay caused by a delay circuit 105-0. When the input signal BA2 reaches "1," the output signal LD2 is likewise set to "1" and the output signal LD1 becomes "0" after a predetermined delay. When the input signal BA3 reaches "1," the output signal LD3 is likewise set to "1" and the output signal LD2 becomes "0" after a, predetermined delay. Finally at time t4 when the input signals BA0 through BA3 all become "0," an output 1 DB of an OR gate 106 is set to "0." At this point, a signal LT3 set so far to "1" reaches "0." The output signal LD3 becomes "0" after a predetermined delay.

As described, any one of the voltage limiter circuit VDL0 through VDL3 is turned on when an active command for activating the nearby memory bank is input, and is turned off when an active command for activating any other memory bank is input. That is, each voltage limiter circuit drives the power supply line. The driving force (driving ability) for each voltage limiter circuit to drive the power supply line may be variably controlled while the corresponding memory bank is active. Immediately after a bank active command is input, a large current flows because of a sense amplifier operation that is triggered. The current flowing in that period is supplied from the voltage limiter circuit near the bank in question. Because only a current large enough to sustain the voltage level flows following the sense amplifier activation, either a circuit far away from the bank or the standby voltage limiter circuit VDLS can supply a sufficient current. That is because the outputs of the voltage limiter circuits are interconnected. Under such a control scheme, even with a plurality of memory banks activated, only one voltage limiter circuit besides the VDLS is active most of the time (although two or more voltage limiter circuits may be turned on temporarily). Naturally, only one voltage limiter circuit is active in addition to the VDLS in active standby mode. Compared with the conventional setup where all voltage limiter circuits are activated during operation, the inventive scheme significantly reduces power dissipation in the active standby state. Since many synchronous DRAMs in operation have their memory banks left active to take advantage of the high-speed data transfer feature, the drop in active standby current contributes appreciably to a reduction in the power dissipation of the system as a whole.

Each voltage limiter circuit is turned off for a predetermined period of time after the input of a bank active command for activating another bank for the following reason: a large current flows immediately after a bank active command is input. The time during which the large current flows is from 10 to 30 ns depending on the process technique and design concept in use. Meanwhile, the intervals at which bank active commands are continuously input are stipulated for all synchronous DRAMs; and the internals are usually made of two clock cycles. Illustratively, if the clock frequency is 100 MHz, the intervals are 20 ns long. This means that if an active command for the bank 1 is input two clock cycles after the input of an active command for the bank 0, there is a possibility that a large current is still flowing through the bank 0. Immediately turning off the voltage limiter circuit VDL0 at that point will cause a large current to be supplied from the circuit VDL1 far away from the bank 0. In that case, a voltage drop due to line resistance can trigger a malfunction or an operation delay, which can lead to negative consequences.

Figure 7:
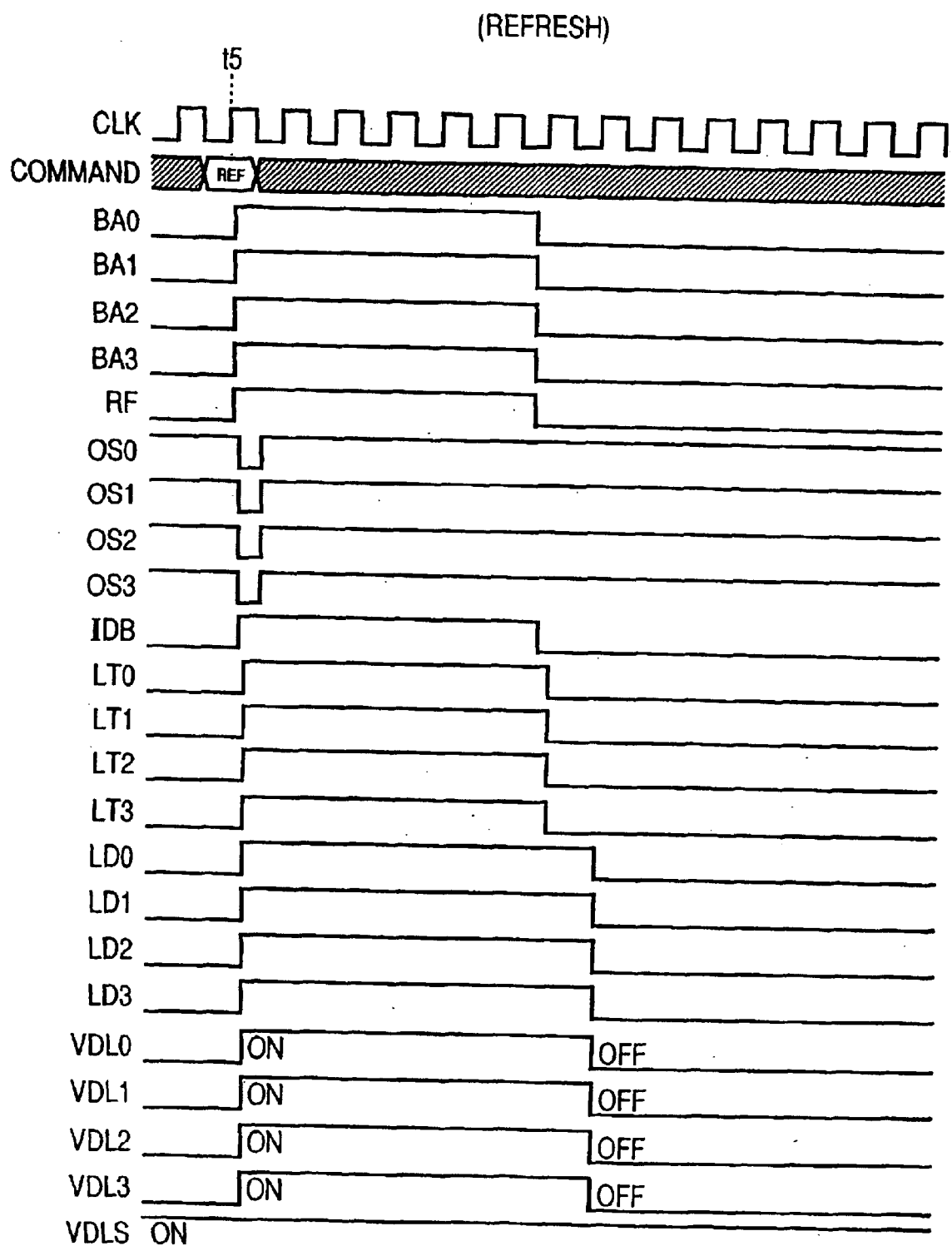
FIG. 7 is another operation waveform chart applicable to the control circuit in FIG. 5.

FIG. 7 is another operation waveform chart applicable to the control circuit of FIG. 5 in a refresh mode (auto-refresh represented by a standardized SDRAM command REF). Inputting an auto-refresh command activates all banks simultaneously. In each bank, a word line indicated by a refresh counter is activated so as to refresh one-word memory cells. At time t5 when a refresh command (REF) is input, all bank active signals BA0 through BA3 and the refresh signal RF are set to "1." This sets the latch outputs LT0 through LT3 as well as the output signals LD0 through LD3 to "1." When the refresh operation terminates in the chip (at this time no command input is required), the signals RF and BA0 through BA3 are set to "0"; the output IDB of the OR gate 106 becomes "0," the latch outputs LT0 through LT3 reach "0," and the output signals LD0 through LD3 are set to "0" after a predetermined delay. That is, the voltage limiter circuits VDL0 through VDL3 are turned on at the same time in the refresh mode. The simultaneous circuit activation is intended to supply a current four times as large as that in normal operation because all banks operate simultaneously in the refresh mode. The standby voltage limiter circuit VDLS is continuously in operation.

The control circuit CTL1 will now be described with reference to the circuit diagram of FIG. 8 and the operation waveform charts of FIGS. 9 through 12. The input signal CKE is a clock enable signal that is supplied externally. PDMB denotes a signal that is set to "0" in power-down mode or self-refresh mode (to be described later) and is set to "1" otherwise. RF represents a refresh signal that is set to "1" when the memory is being refreshed. BA indicates a signal that is set to "1" when a bank active command is input. RD and WR stand for signals that are set to "1" in a read mode and in a write mode respectively. The output signal LC4 is used to turn on and off the VCL limiter circuit VCL4 as described above (set to "1" for circuit activation and to "0" for deactivation). The output signal LC5 is a signal that turns on and off the VCL limiter circuits VCL5 and VCL6 as mentioned above (set to "1" for circuit activation and to "0" for deactivation).

Figure 8:
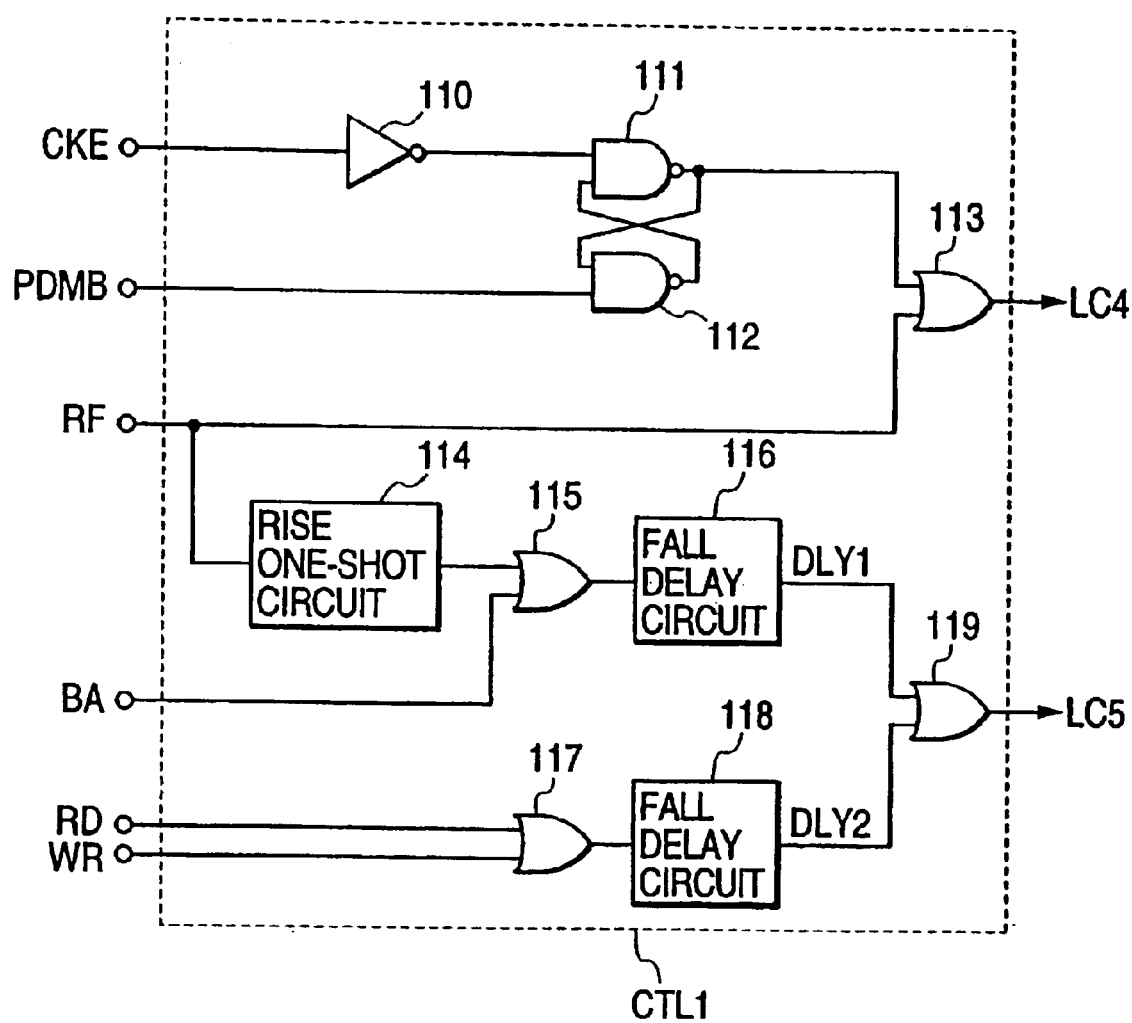
FIG. 8 is a circuit diagram of a voltage limiter control circuit CTL1 in the synchronous DRAM of FIG. 1.
Figure 9:
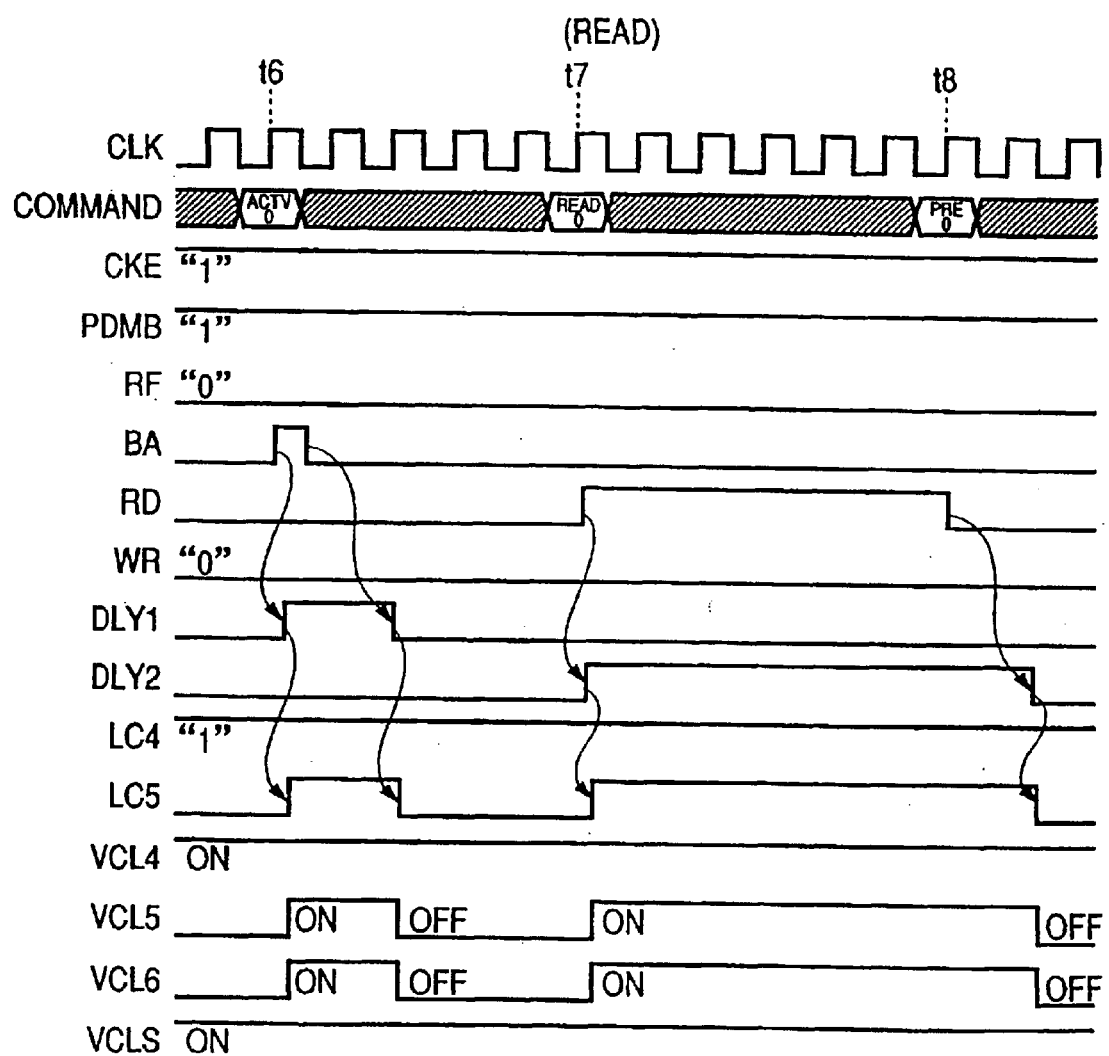
FIG. 9 is an operation waveform chart applicable to the control circuit in FIG. 8.

FIG. 9 is an operation waveform chart applicable to the control circuit in FIG. 8 when the bank 0 is activated and data are read therefrom. At time t6 when an active command (ACTV0) for the bank 0 is input, the signal BA is set to "1" while the command is being input, and an output DLY1 of the delay circuit 106 reaches "1" for a predetermined period of time. At time t7 when a read command (READ0) for the bank 0 is input, the signal RD is set to. "1" because a read mode is selected, and an output DLY2 of the delay circuit 108 becomes "1." At time t8 when a precharge command (PRE0) for the bank 0 is input, the signal RD becomes "0" and the output DLY2 reaches "0" with a slight delay. Because the output signal LC5 is obtained by OR' ing DLY1 and DLY2, the signal LC5 is set to "1" immediately after the input of a bank active command as well as in read mode. The output signal LC4 is always "1" since the clock enable signal CKE is "1."

As described, the voltage limiter circuits VCL4 through VCL6 and VCLS are all turned on immediately after the input of a bank active command as well as in a read mode. Otherwise the circuits VCL4 and VCLS alone are turned on and the circuits VCL5 and VCL6 are turned off. Immediately after the input of the bank active command, a large current flows because the address buffer and row decoders are activated. A large current also flows in a read mode in which the column decoders, main amplifier and output buffer are activated. In these periods, all voltage limiter circuits are turned on to supply the large current. In other periods, only a small current flows, so that part of the circuits are deactivated. Specifically, the period in which the circuits VCL5 and VCL6 operate should be made as long as or slightly longer than (to allow for some margins for fluctuations) the period in which the row decoders and column decoders operate in connection with the activation of a bank and the reading of data therefrom. Under such a control scheme, only one voltage limiter circuit besides the VCLS is active in an active standby mode (i.e., from bank activation until the input of a read command). Thus compared with the conventional setup where all voltage limiter circuits are turned on in operation, the inventive scheme significantly reduces power dissipation in an active standby mode.

Whereas the description above has centered on read operations, the description also applies to write operations taking place in the same manner except that the signal WR instead of the signal RD is set to "1." In write operations, the active standby current may be reduced in the like manner.

Figure 10:
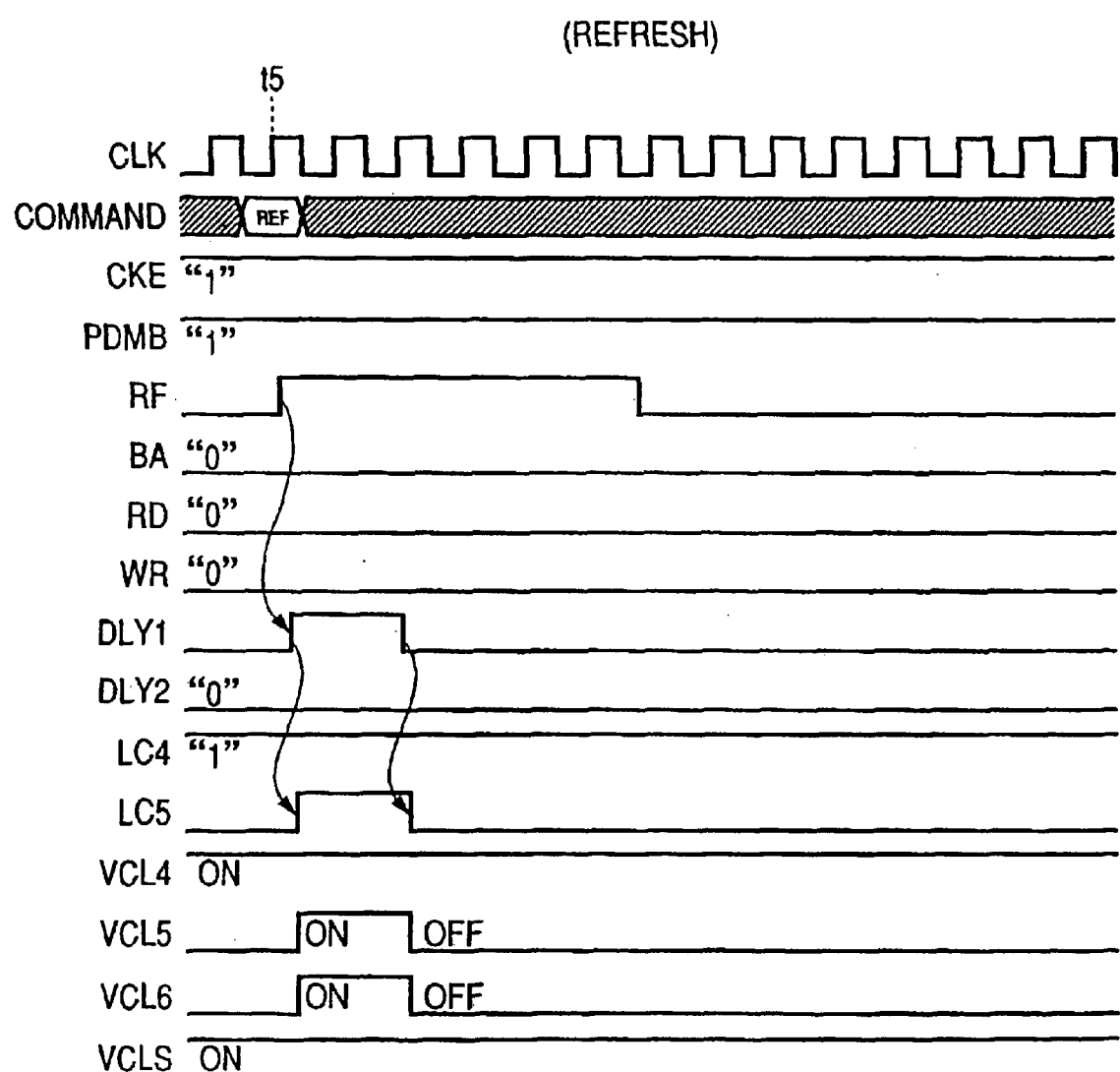
FIG. 10 is another operation waveform chart applicable to the control circuit in FIG. 8.

FIG. 10 is another operation waveform chart applicable to the control circuit of FIG. 8 in the refresh mode (auto-refresh). As in the case of FIG. 7, when a refresh command (REF) is input at time t5, the refresh signal RF is set to "1" as long as the refresh operation is being performed. The output signal LC5 is set to "1" for a predetermined period of time by a one-shot pulse generating circuit 114 and a delay circuit 116, and is thereafter brought to "0." Since the clock enable signal CKE is "1," the output signal LC4 is always "1." Thus immediately after the start of a refresh operation, all voltage limiter circuits VCL4 through VCL6 and VCLS are turned on. Later, the circuits VCL5 and VCL6 are turned off. Immediately after the refresh operation has started, a large current flows because of the operation of the row decoders and other elements. During that period, all voltage limiter circuits are activated to supply the large current. Thereafter, with only a small current flowing, part of the circuits are deactivated to minimize power dissipation.

Figure 11:
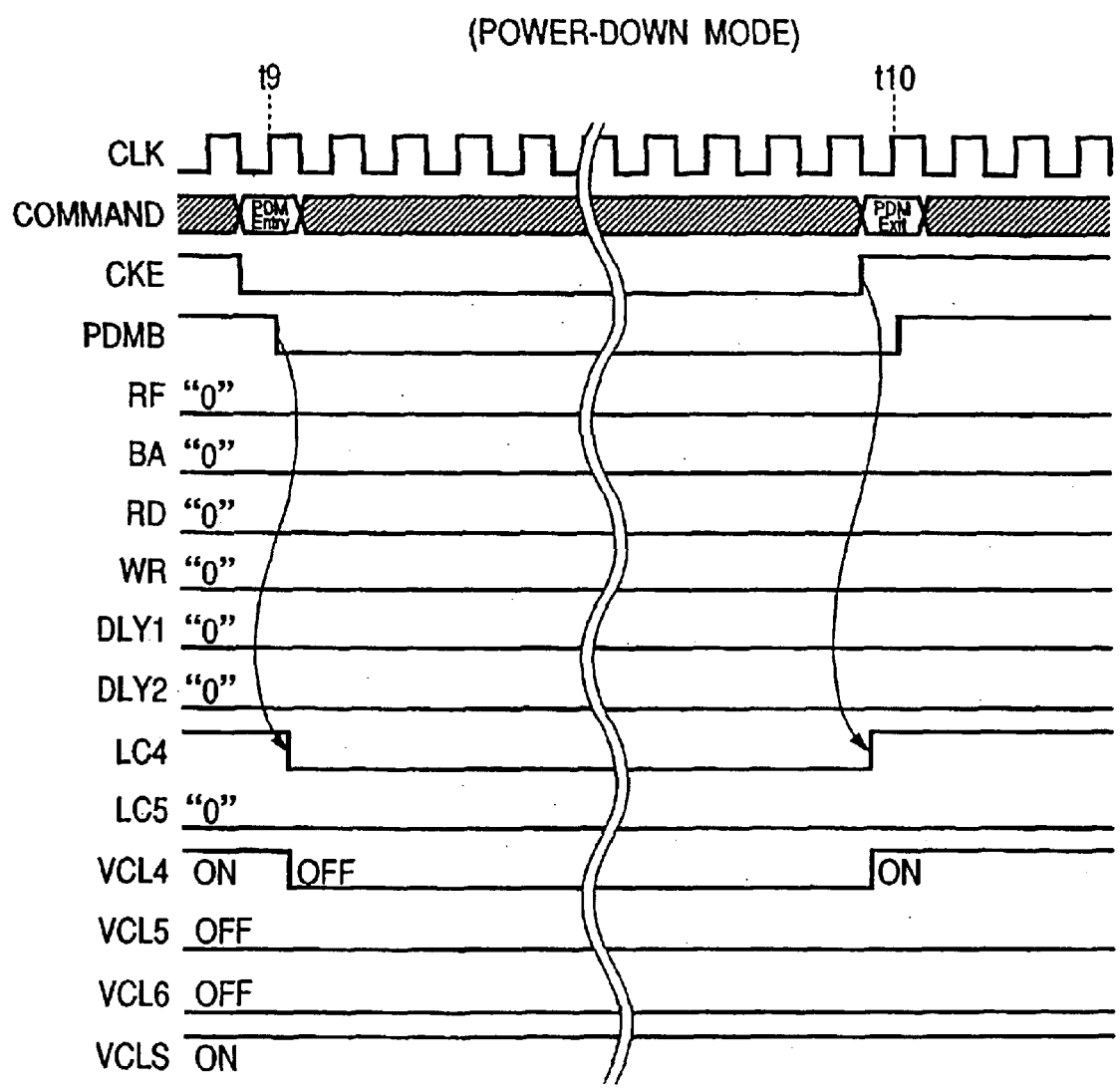
FIG. 11 is another operation waveform chart applicable to the control circuit in FIG. 8.

FIG. 11 is another operation waveform chart applicable to the control circuit of FIG. 8 in a power-down mode. Power-down mode is a low power dissipation mode corresponding to a normal standby state of the DRAMs (in which all data lines are precharged to VDL/2). DRAMs have a standardized method for designating the start and end of power-down mode by use of the clock enable signal CKE, among others. This embodiment also employs the standardized method. At time t9 when a power-down mode start command (PDM Entry) is input, the signal PDMB reaches "0," which sets the output signal LC4 to "0." The signal CKE is set to "1" before time t10 when a power-down mode end command (PDM Exit) is to be input. Thus at time t10, the output signal LC4 is set to "1." Because the signals LC4 and LC5 are set to "0" in a power-down mode, the voltage limiter circuits VCL4 through VCL6 are all turned off and only the standby voltage limiter circuit VCLS is turned on. It follows that power dissipation is minimized while a power-down mode is in effect.

The fall of the signal LC4 is determined by the signal PDMB while its rise is decided by the clock enable signal CKE for the following reasons: the specifications of synchronous DRAMs stipulate that a power-down mode be terminated by setting the clock enable signal CKE to "1" at a leading edge of the clock signal CLK. The signal CKE must be set to "1" earlier than the rise of the clock signal 'CLK by a set-up time (usually 2 to 3 ns). This means that the signal LC4 is raised earlier if the end of the power-down mode is judged based on the signal CKE than if the end of the mode is determined as per the signal PDMB. Since there is a possibility that a bank active command or a like command may be input during the clock cycle immediately after the power-down mode end command, the voltage limiter circuit VCL4 should preferably be turned on earlier than usual in preparation for the command input.

Figure 12:
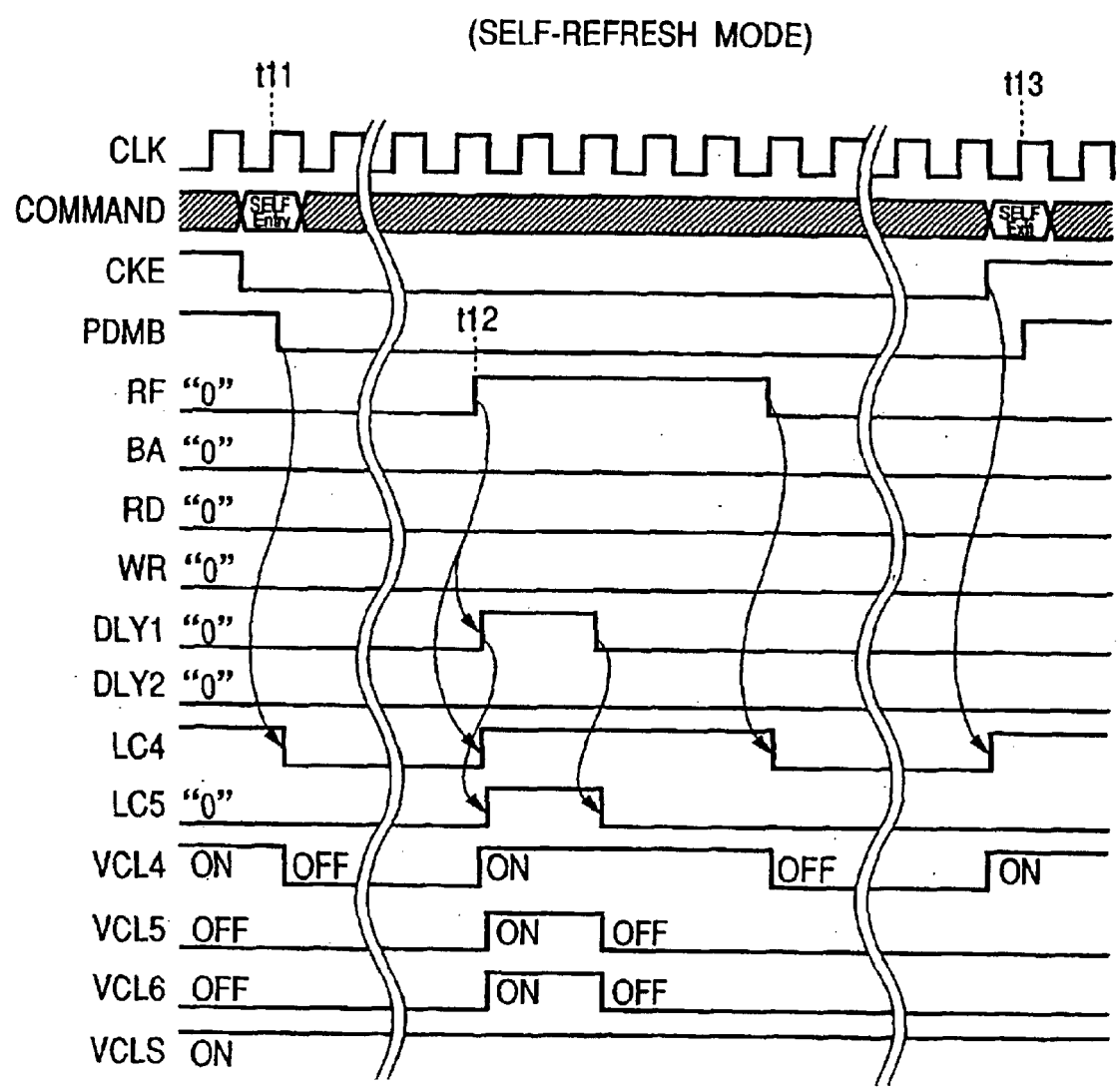
FIG. 12 is another operation waveform chart applicable to the control circuit in FIG. 8.

FIG. 12 is another operation waveform chart applicable to the control circuit of FIG. 8 in a self-refresh mode. When a self-refresh command is input, the SDRAM is refreshed periodically according to an internal timer until a self-refresh end command is entered. At time t11 when a self-refresh start command (SELF Entry) is input, the signal PDMB is set to "0" bringing the output signal LC4 to "0." When the timer in the chip starts a refreshing operation at time t12, the signal RF is set to "1." The output signal LC4 is at "1" while the signal RF is "1." The output signal LC5 remains at "1" for a predetermined Period of time following arise of the signal RF. The signal CKE is at "1" before time t13 when a self-refresh mode end command (SELF Exit) is to be input. When time t13 is reached, the signal LC4 is set to "1." Thus in a self-refresh mode, the voltage limiter circuits VCL4 through VCL6 are turned on only when the refresh operation is being actually performed and are turned off otherwise. Refresh operations are carried out usually at intervals of tens to hundreds of microseconds.

A single refresh operation is completed in tens of ns, which means that the duration of the refresh operations accounts for 0.1% or less of all operation times. Inmost of the remaining operation times, the voltage limiter circuits VCL4 through VCL6 are all turned off and only the standby voltage limiter circuit VCLS is turned on. As a result, the power dissipation in the self-refresh mode is quite limited.

Figure 13:
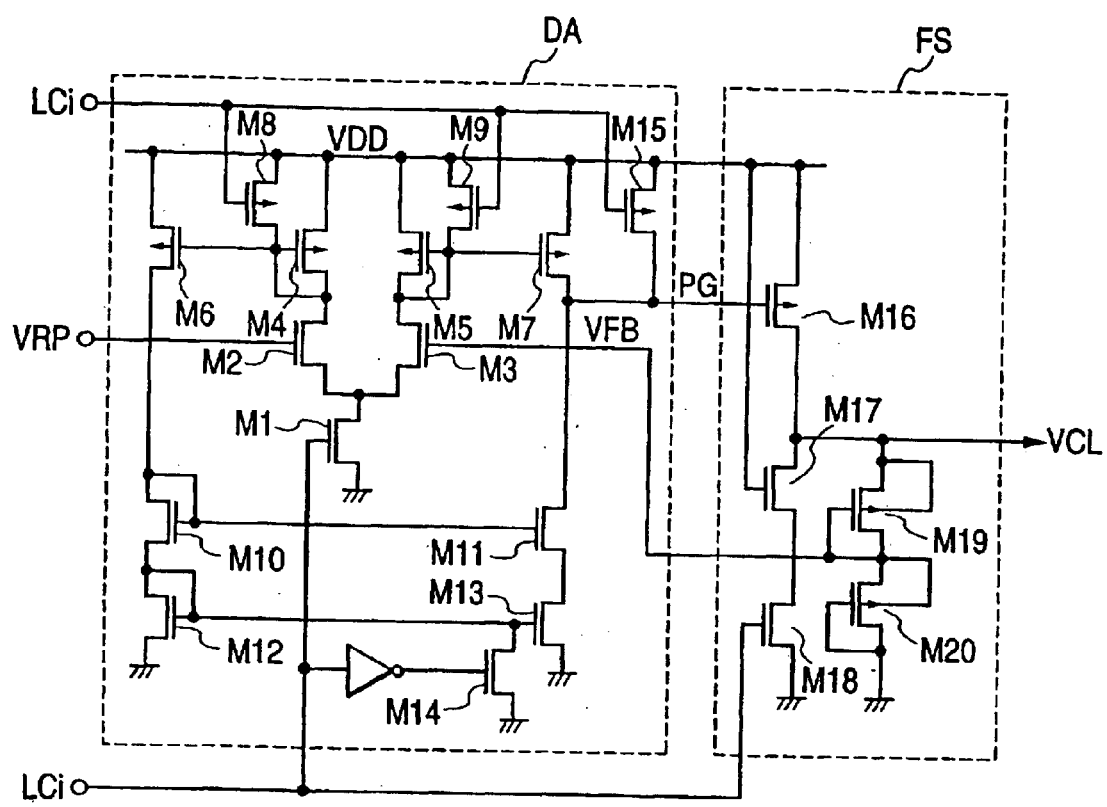
FIG. 13 is a circuit diagram of voltage limiter circuits VDL0 through VDL3 in the synchronous DRAM of FIG. 1.

FIG. 13 is a circuit diagram of a typical VCL voltage limiter circuit. The circuit comprises a differential amplifier DA and an output stage FS. The differential amplifier DA is activated when an active command LCi is "1" (High level). When active, the amplifier DA compares a voltage VFB with the reference voltage VRC, the voltage VFB being obtained by dividing the output voltage VCL by two P-channel MOS transistors M19 and M20. An output PG of the differential amplifier DA is input to the gate of a P-channel MOS transistor M16 in the output stage. A drop in the VCL potential leads to a decline in the PG potential, turning on the MOS transistor M16 to charge the VCL from the VDD. An excess rise in the VCL potential causes a leakage circuit made up of N-channel MOS transistors M17 and M18 to discharge the VCL. When the active signal LCi is at "0" (Low level), an N-channel MOS transistor MI is turned off; P-channel MOS transistors M8, M9 and M15 are turned on; and an N-channel MOS transistor M14 is turned on. This in turn activates P-channel MOS transistors M4 through M7 and deactivates N-channel MOS transistors M12 and M13, thereby cutting off all currents flowing through the differential amplifier DA. In addition, the MOS transistors M16 and M18 in the output stage are turned off. As a result, the power dissipation consisting only of currents flowing through the voltage dividers M19 and M20 is at a level significantly lower than that in the operating state. The transistors M19 and M20 are continuously supplied with currents to stabilize the level of the voltage VFB in preparation for the next activation of the differential amplifier DA.

Figure 14:
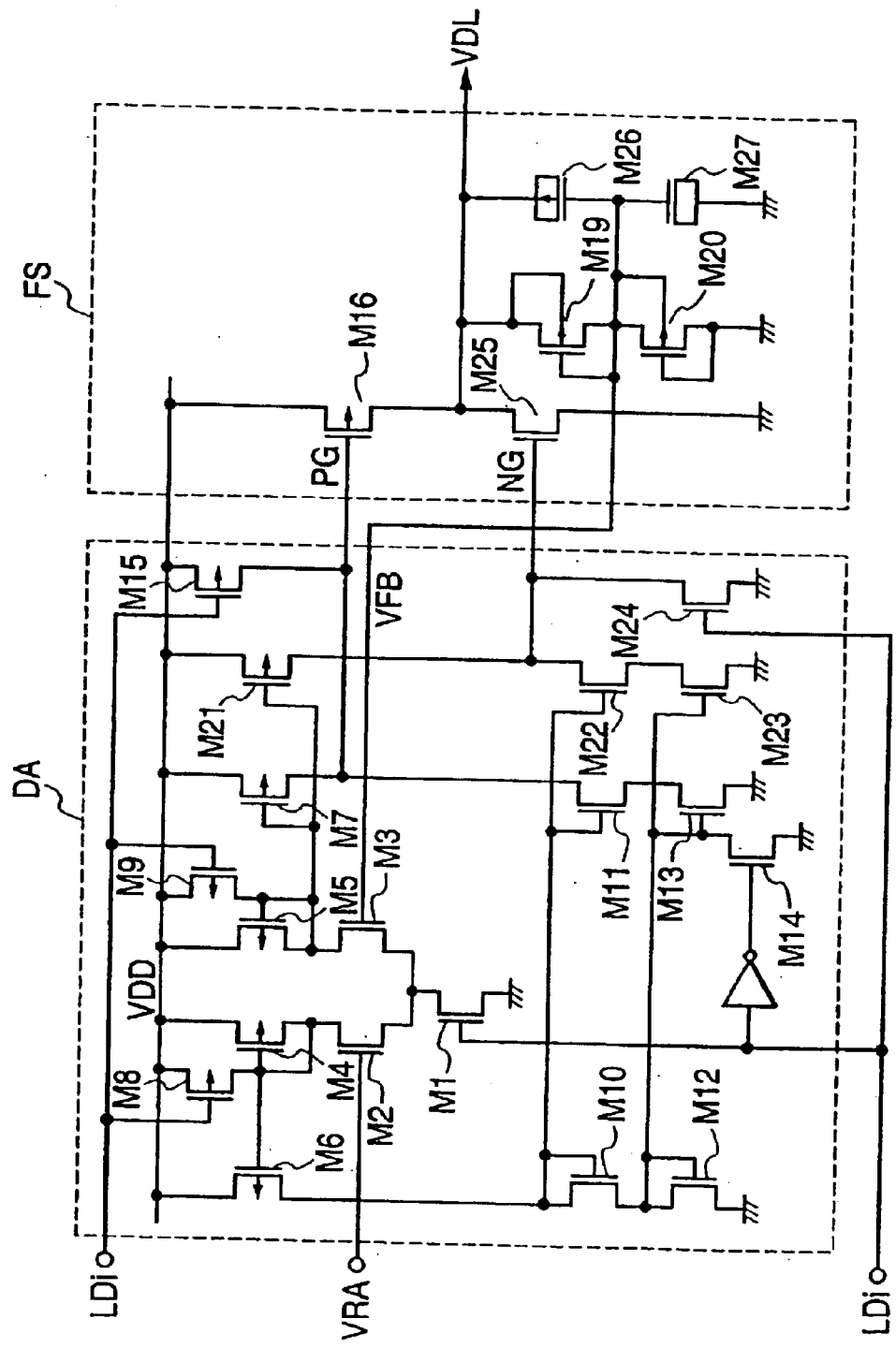
FIG. 14 is a circuit diagram of voltage limiter circuits VCL4 through VCL6 in the synchronous DRAM of FIG. 1.

FIG. 14 is a circuit diagram of a typical VDL voltage limiter circuit. The difference between the circuit of FIG. 14 and that of FIG. 13 is that the setup of FIG. 14 has a reinforced capability of discharging at the time of an excess rise in the output voltage VDL. In FIG. 14, a differential amplifier DA has two outputs PG and NG. The output PG is input to the P-channel MOS transistor M16 as in the circuit of FIG. 13, while the output NG is input to the gate of an N-channel MOS transistor M25. An excess rise in the VDL potential leads to an increase in the NG potential, which causes the transistor M25 to discharge the VDL. The arrangement above is incorporated to deal with the situation where the overdrive technique (see FIG. 3) is utilized, i.e., where the VDL potential can be raised too high. Meanwhile, although this embodiment has been described with four banks, the number of banks may be changed as desired as long as the number is an integer. Preferably, the number of banks should be 2 to the n-th power, "n" being an integer (e.g., 2, 4, 8, 16, 32, etc.). Whereas other embodiments to be described below will also have four banks, that number of banks is used only for purposes of illustration and is not limitative of the invention.

The control scheme described above is made possible when the number of voltage limiter circuits (excluding standby voltage limiter circuits) generating the first internal voltage VDL is made equal to the number of banks configured (four with this embodiment). On the other hand, although this embodiment has three voltage limiter circuits (excluding standby voltage limiter circuits) generating the second internal voltage VCL, the circuit count is optional as long as there are at least two circuits. That is, one voltage limiter circuit is controlled by the control signal LC4 and the other circuit by the signal LC5. As standby voltage limiter circuits, one or more circuits are needed for the voltage VDL and one or more for the voltage VCL. Preferably, there should be only one standby voltage limiter circuit for each of the voltages VDL and VCL so as to minimize power dissipation in the standby mode.

Second Embodiment

Figure 15:
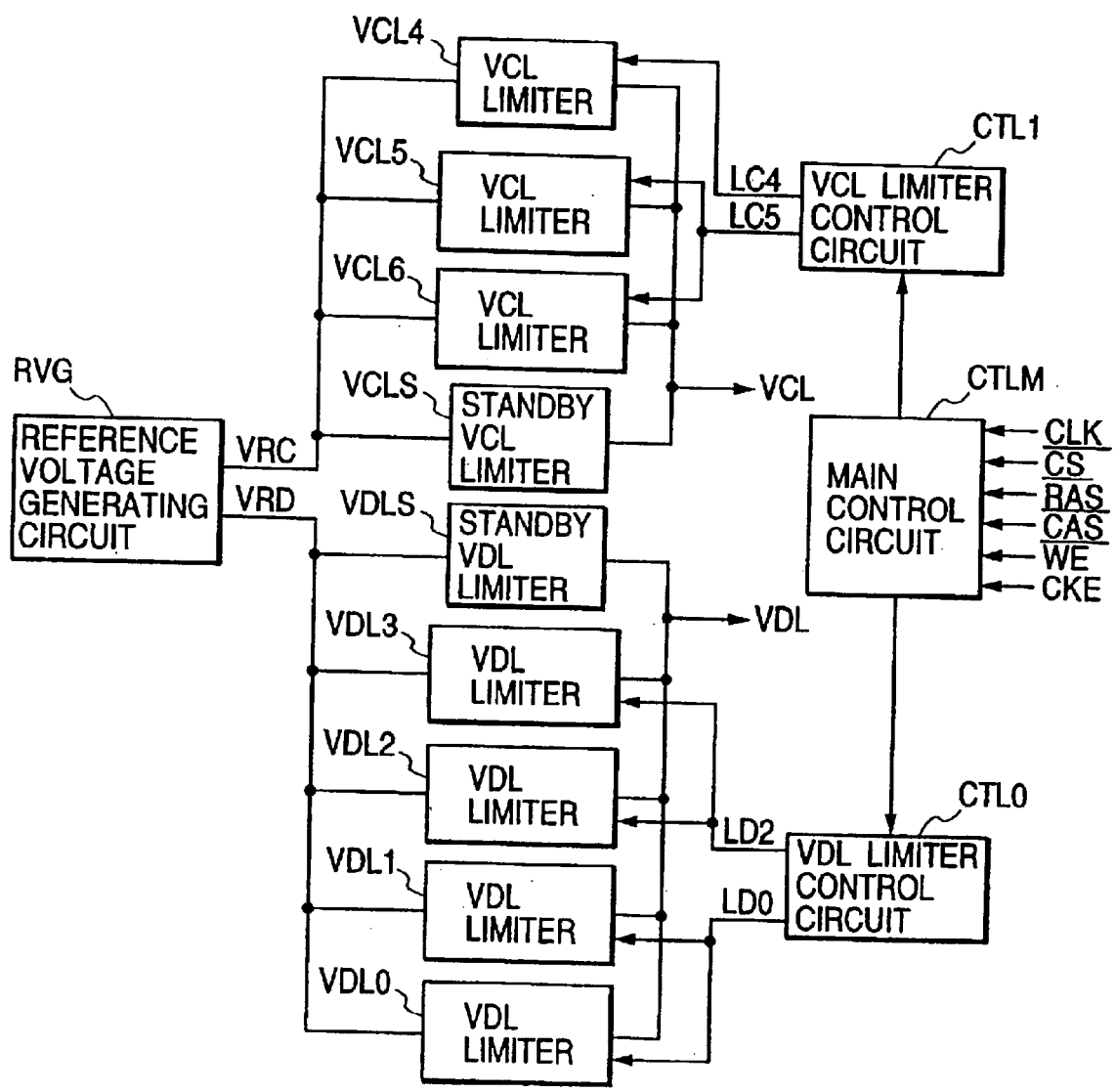
FIG. 15 is a block diagram of a synchronous DRAM practiced as a second embodiment of this invention.

The second embodiment of this invention will now be described. The layout of circuits in the second embodiment is the same as that in FIG. 1 and will not be described here. FIG. 15 depicts connective relations between the circuits involved. What makes the setup of FIG. 15 different from that of FIG. 4 is that the voltage limiter circuits VDL0 and VDL1 are controlled collectively by the active signal LD0 and the circuits VDL2 and VDL3 by the active signal LD2.

Figure 16:
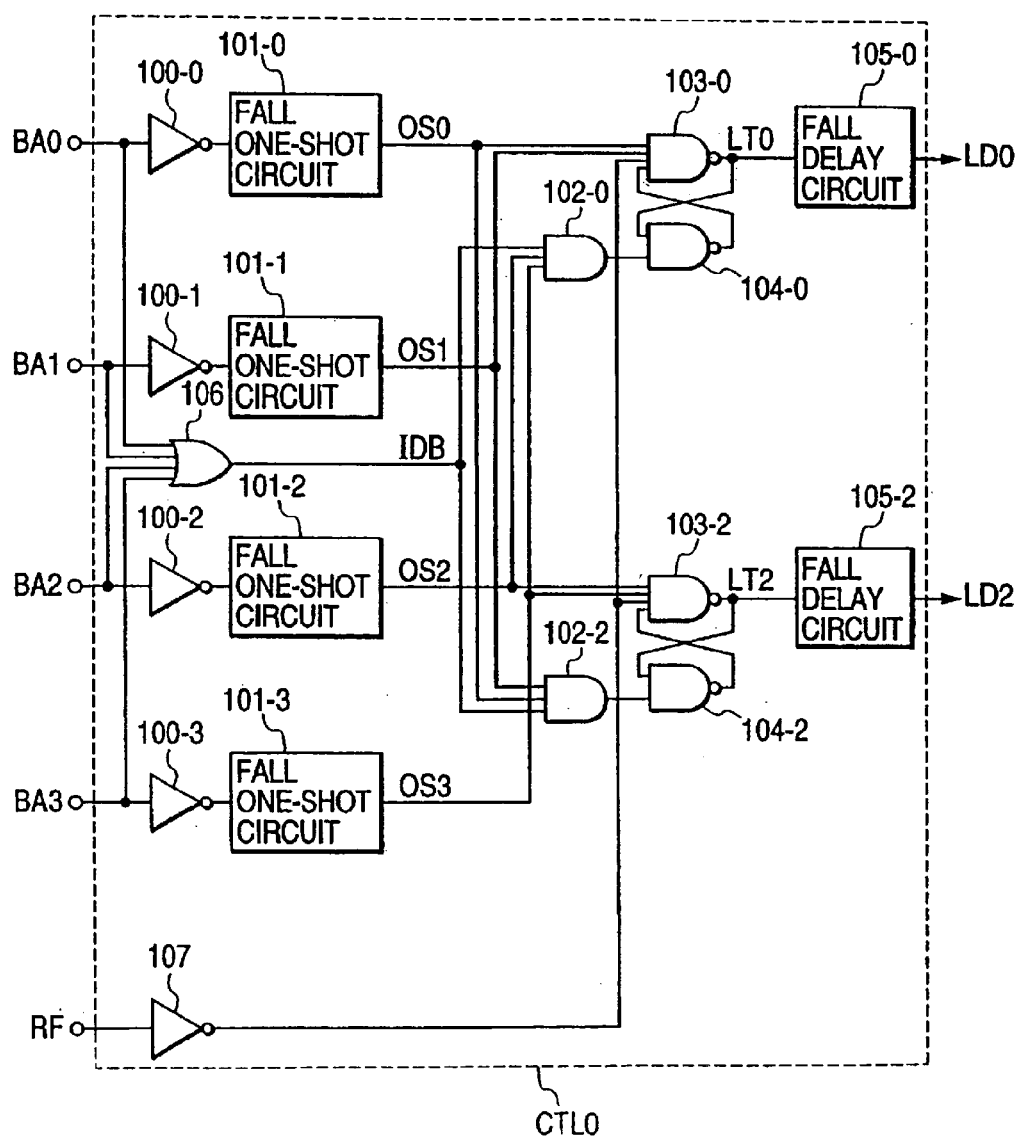
FIG. 16 is a circuit diagram of a voltage limiter control circuit CTL0 in the synchronous DRAM of FIG. 15.
Figure 17:
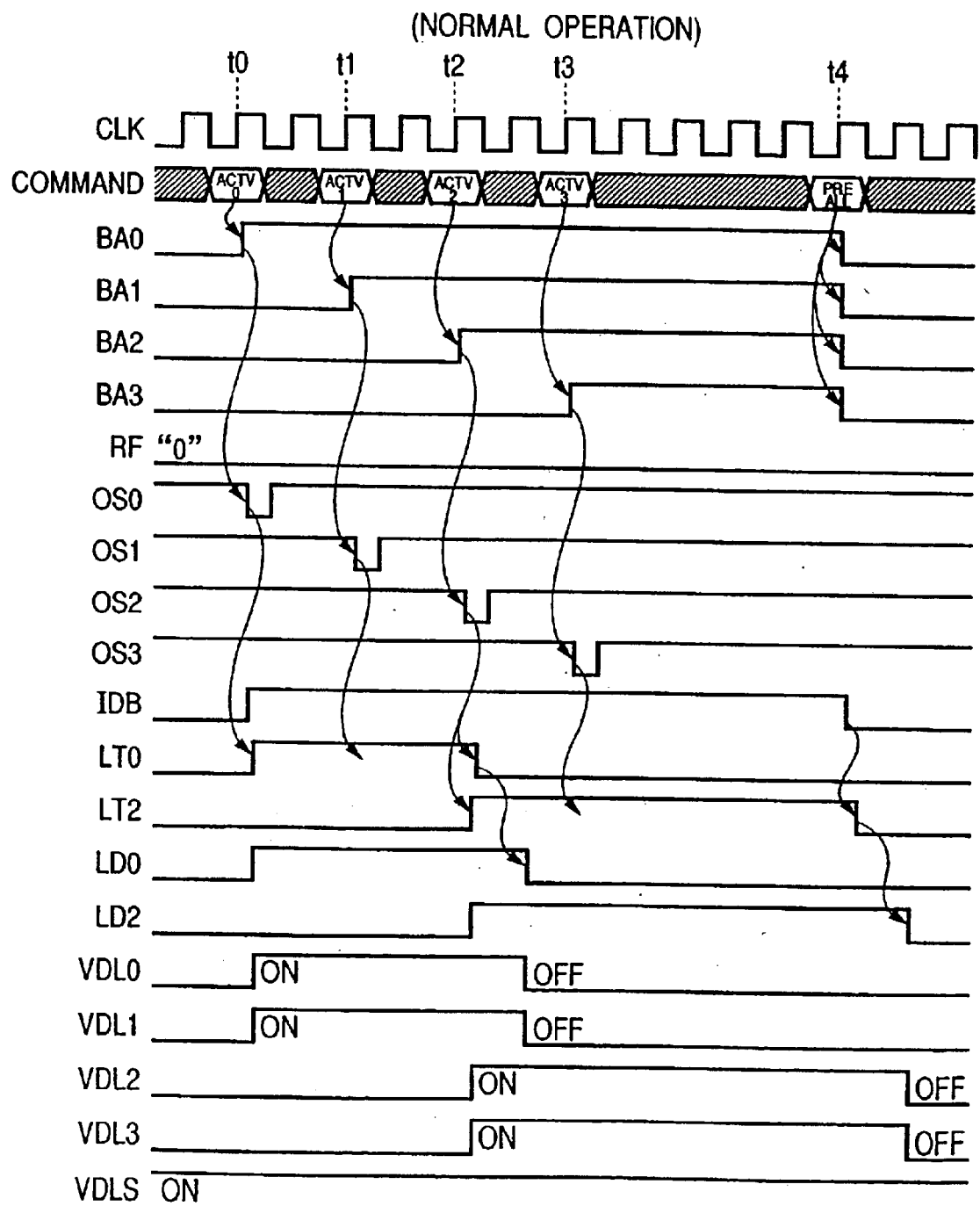
FIG. 17 is an operation waveform chart applicable to the control circuit in FIG. 16.

FIG. 16 is a circuit diagram of the voltage limiter control circuit CTL0, and FIG. 17 is an operation waveform chart applicable to the control circuit in FIG. 16. As in the waveform chart of FIG. 6, the waveforms in FIG. 17 are in effect when active commands to active the banks 0, 1, 2 and 3 are input at times t0, t1, t2 and t3 respectively, with an all-bank precharge command being entered at time t4. When the active signal BA0 is first set to "1," the signal OS0 becomes "0" for a predetermined period of time as with the case in FIG. 6. An output LT0 of a latch made of NAND gates 103-0 and 104-0 then becomes "1" and the output signal LD0 is set to "1." When the active signal BA1 is set to "1," the signal OS1 becomes "0" for a predetermined period of time. At this point, the latch outputs LT0 and LT2 remain unchanged. When the active signal BA2 is set to "1," the signal OS2 becomes "0" for a predetermined period of time. As a result, the output LT2 of a latch made of NAND gates 103-2 and 104-2 is set to "1", and the latch output LT0 is set to "0." The output signal LD2 reaches "1," and the signal LD0 becomes "0" following a predetermined delay caused by the delay circuit 105-0. When the active signal BA3 is set to "1," the signal OS3 becomes "0" for a predetermined period of time but the latch outputs LT0 and LT2 remain unchanged. At time t4 when all active signals BA0 through BA3 are set to "0," the output IDB of the OR gate 106 reaches "0." This sets to "0" the signal LT2 which has been at "1" so far. The output signal LD2 reaches "0" after a predetermined delay.

The voltage limiter circuits VDL0 and VDL1 may be grouped into a single circuit because they are always turned on and off together. The same applies to the circuits VDL2 and VDT3.

In the second embodiment, two voltage limiter circuits are controlled collectively by a single active signal. For that reason, two voltage limiter circuits besides the VDLS are turned on most of the time. Although its ability to save power is not as good as that of the first embodiment, the second embodiment offers the benefit of a simplified control circuit structure and used a smaller number of active signals. This feature is particularly advantageous where the number of banks is considerably large. For example, a memory with 16 banks would need 16 active signals if each bank had one voltage limiter circuit controlled individually. Instead, the second embodiment has the 16 banks grouped into four circuits that are controlled by only four active signals.

The control circuit CTL1 is the same in structure as that of the first embodiment (FIG. 8). Thus no further description will be made of that circuit.

With the second embodiment, the number of VDL voltage limiter circuits (excluding standby voltage limiter circuits) is made equal to the number of banks (i.e., four). Since the circuits VDL0 and VDL1 are controlled by the same control signal LD0 and are turned on and off together thereby, the two circuits may be grouped into a single circuit. The same applies to the circuits VDL2 and VDL3. If VDL voltage limiter circuits controlled by the same control signal are grouped into a single circuit, the number of the voltage limiter circuits in use becomes a measure of the number of the banks configured.

Third Embodiment

Figure 18:
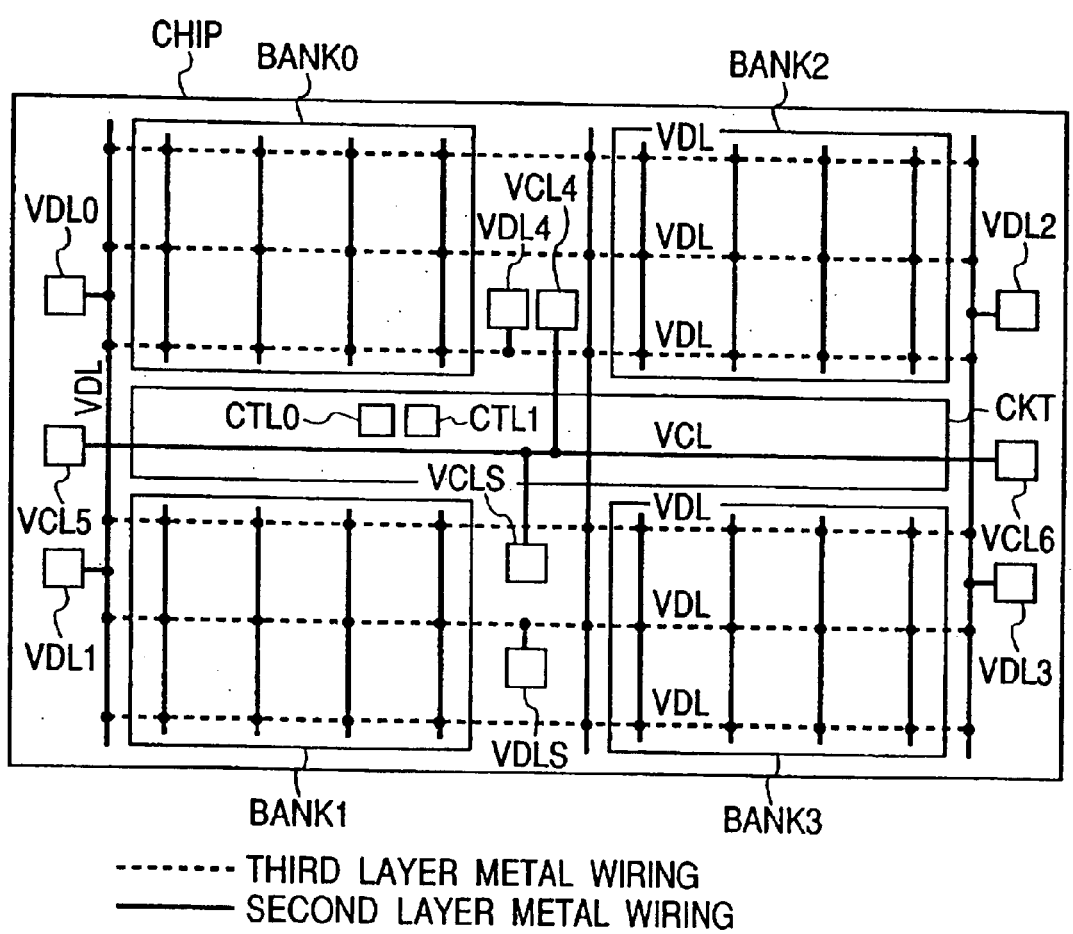
FIG. 18 is a schematic view of a synchronous DRAM practiced as a third embodiment of this invention.
Figure 19:
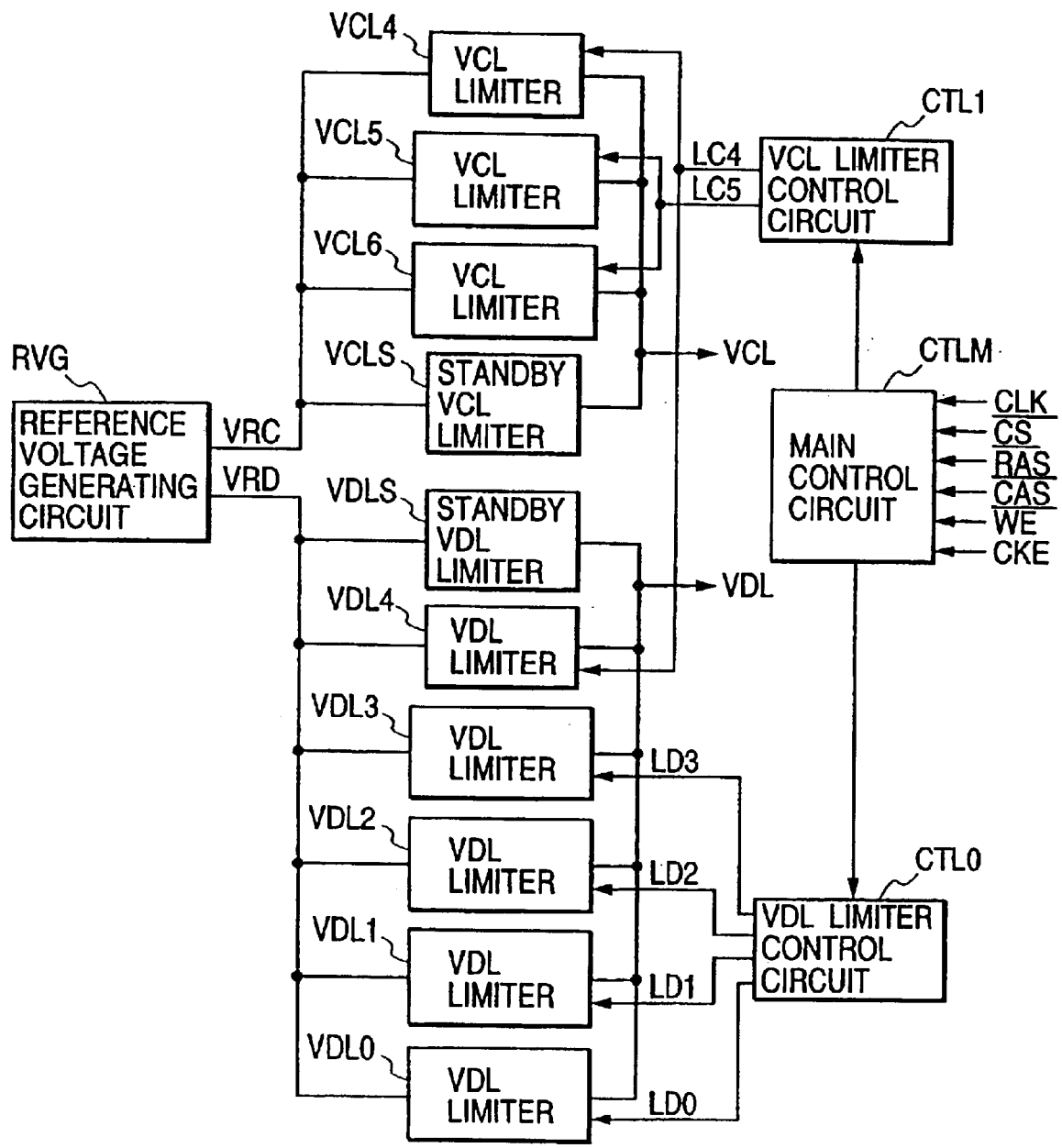
FIG. 19 is a block diagram of power supply circuits in the synchronous DRAM of FIG. 18.

FIG. 18 is a schematic view of a synchronous DRAM practiced as the third embodiment of this invention. The difference between the circuit of FIG. 18 and that of FIG. 1 is that the setup of FIG. 18 comprises an additional VDL voltage limiter circuit VDL4. The circuit VDL4 is controlled by an active signal LC4 as shown in FIG. 19.

Figure 20:
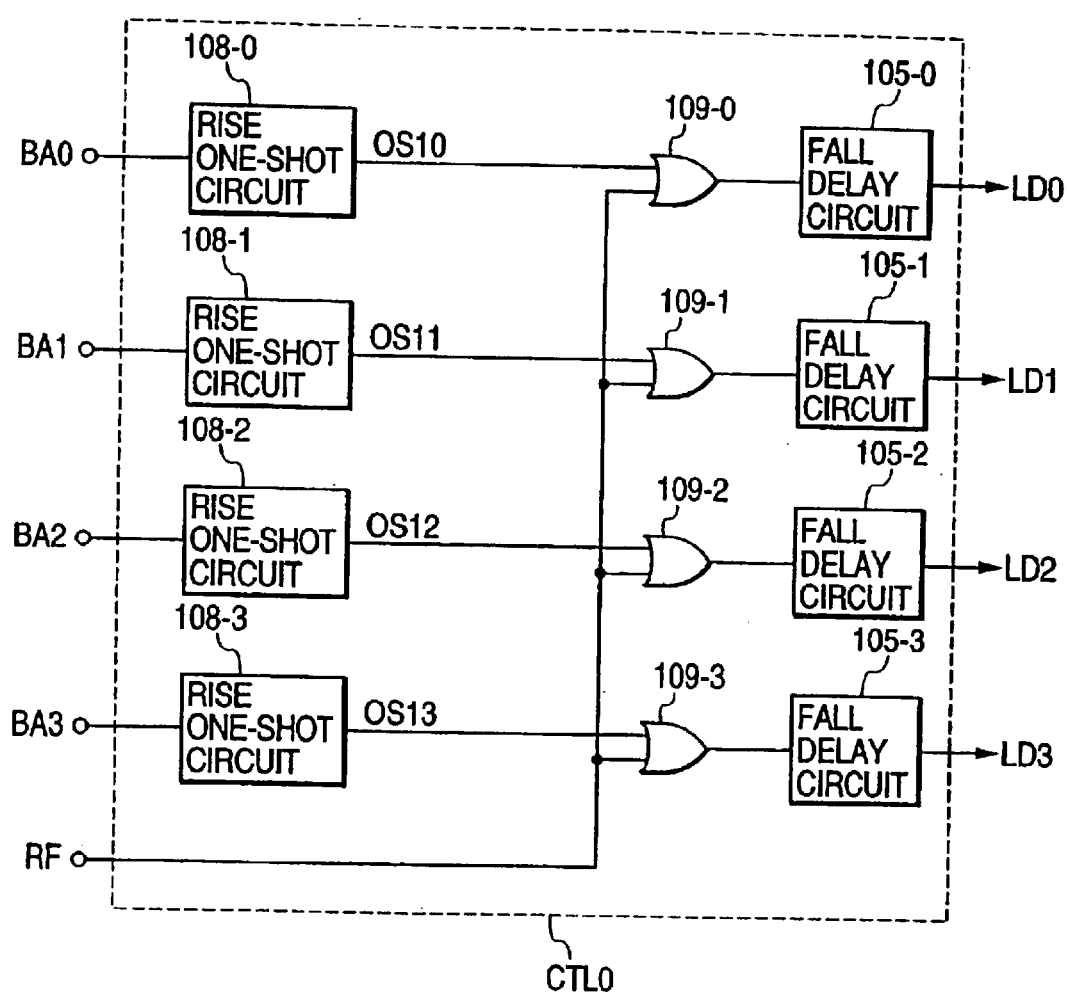
FIG. 20 is a circuit diagram of a voltage limiter control circuit CTL0 in the synchronous DRAM of FIG. 18.
Figure 21:
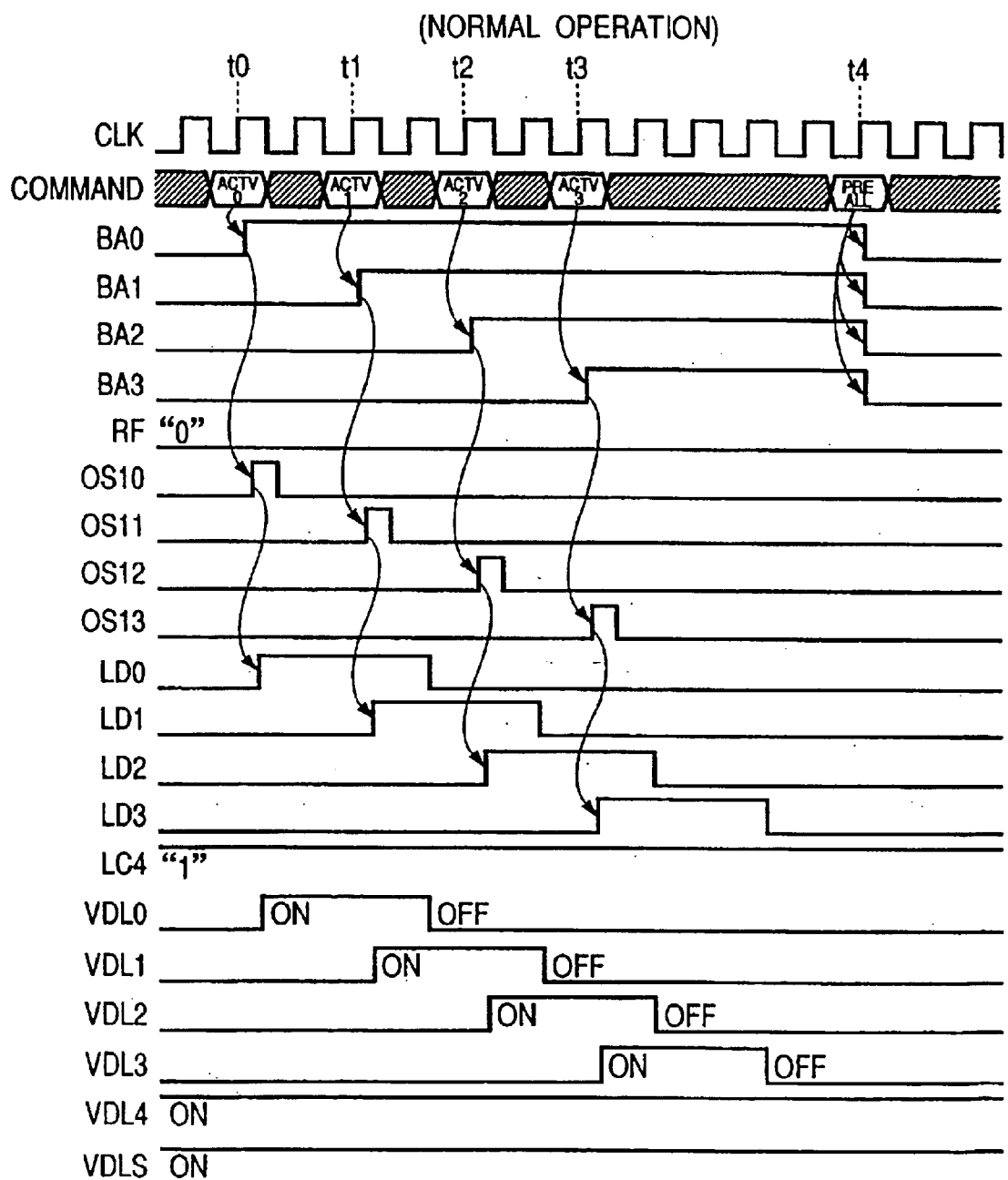
FIG. 21 is an operation waveform chart applicable to the control circuit in FIG. 20.

FIG. 20 is a circuit diagram of a voltage limiter control circuit CTL0 in the SDRAM of FIG. 18, and FIG. 21 is an operation waveform chart applicable to the control circuit in FIG. 20. As in the cases of FIGS. 6 and 17, active commands to activate the banks 0, 1, 2 and 3 are input at times t0, t1, t2 and t3 respectively, with an all-bank precharge command entered at time t4. When the active signal BA0 is first set to "1," an output OS10 of a one-shot pulse generating circuit 108-0 becomes "1" for a predetermined period of time. This causes the output signal LD0 to reach "1" and then to return to "0" with a predetermined delay. When the active signals BA1, BA2 and BA3 are successively set to "1," the output signals LD1, LD2 and LD3 are brought to "1" respectively for a predetermined period of time each. The signal LC4 is always at "1."

As a result, each of the voltage limiter circuits VDL0 through VDL3 is turned on only immediately after the active command corresponding to the memory bank nearby is input. The voltage limiter circuit VDL4 is continuously active. Immediately after a bank active command is entered, a large current flows because of the sense amplifier operation being initiated. The current flowing during that period is derived primarily from the voltage limiter circuit near the bank in question. After the sense amplifier operation, only a small current flows which can be supplied adequately from the voltage limiter circuit VDL4 or VDLS. Under such a control scheme, even if a plurality of memory banks are turned on (although two or more voltage limiter circuits are together activated temporarily), the only voltage limiter circuits being active most of the time are VDLS and VDL4.

Needless to say, only the voltage limiter circuits VDLS and VDL4 are turned on in the active standby mode. Compared with conventional setups where all voltage limiter circuits are activated during operation, the power dissipation in the active standby mode is thus reduced considerably.

As is clear from the above description, the power supplying capability of the voltage limiter circuit VDL4 is allowed to be smaller than that of the circuit VDL0, VDL1, VDL2 or VDL3 but should preferably be larger than that of the circuit VDLS. That is because a current for inverting the potential of a bit line pair flows in the write mode, the current being supplied from the circuit VDL4 (with the circuits VDL0 through VDL3 being turned off). Controlled by the active signal LC4, the circuit VDL4 is turned off in power-down mode or in self-refresh mode (see FIGS. 11 and 12).

A major advantage of the third embodiment is thus a simplified structure of the control circuit CTL0. The structural simplicity becomes apparent when FIGS. 20, 5 and 16 are compared with each other. The control circuit CTL1 is the same in structure as that of the first embodiment (FIG. 8). Thus no further description will be made of that circuit. With the third embodiment, whenever the number of banks in use is changed, the minimum number of VDL voltage limiter circuits configured (excluding standby voltage limiter circuits) need only be made equal to the number of the banks being used plus 1. That is, there should be one circuit corresponding to each bank and at least one circuit controlled by the signal LC4.

Fourth Embodiment

Figure 22:
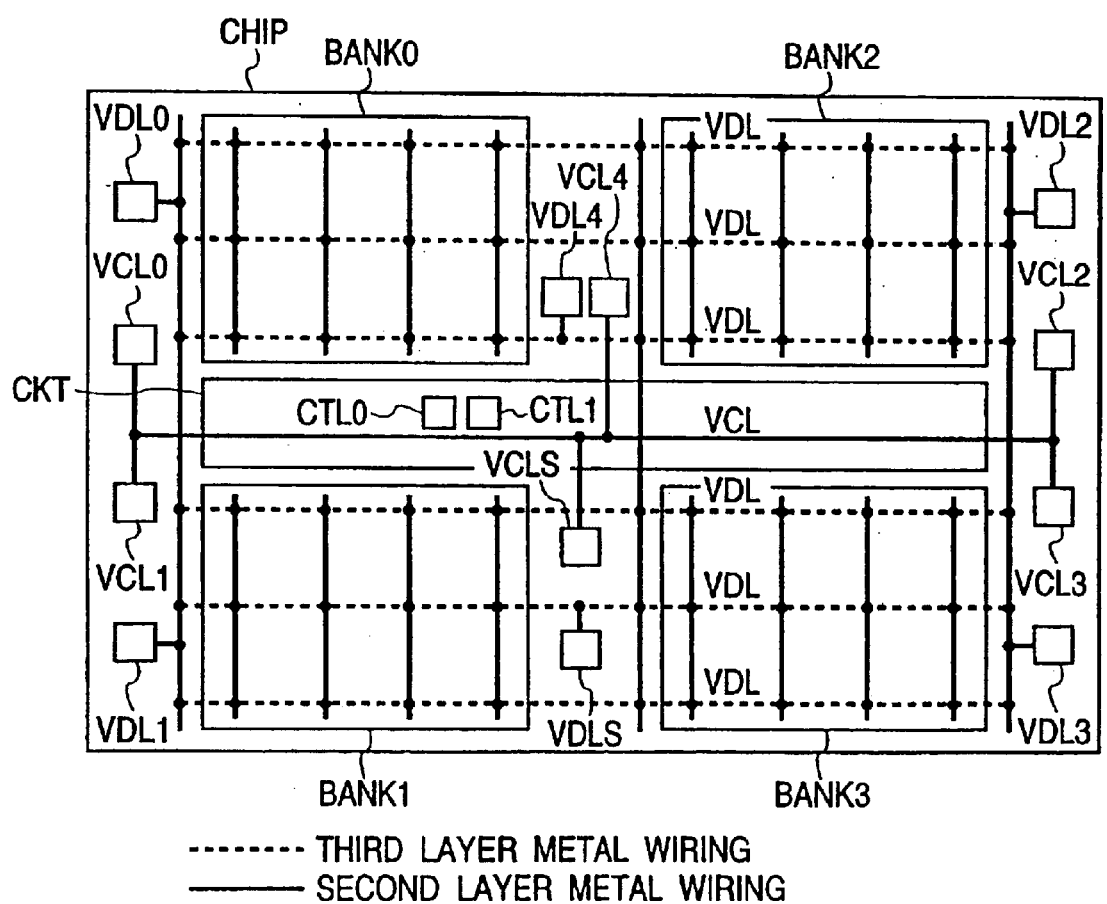
FIG. 22 is a schematic view of a synchronous DRAM practiced as a fourth embodiment of this invention.
Figure 23:
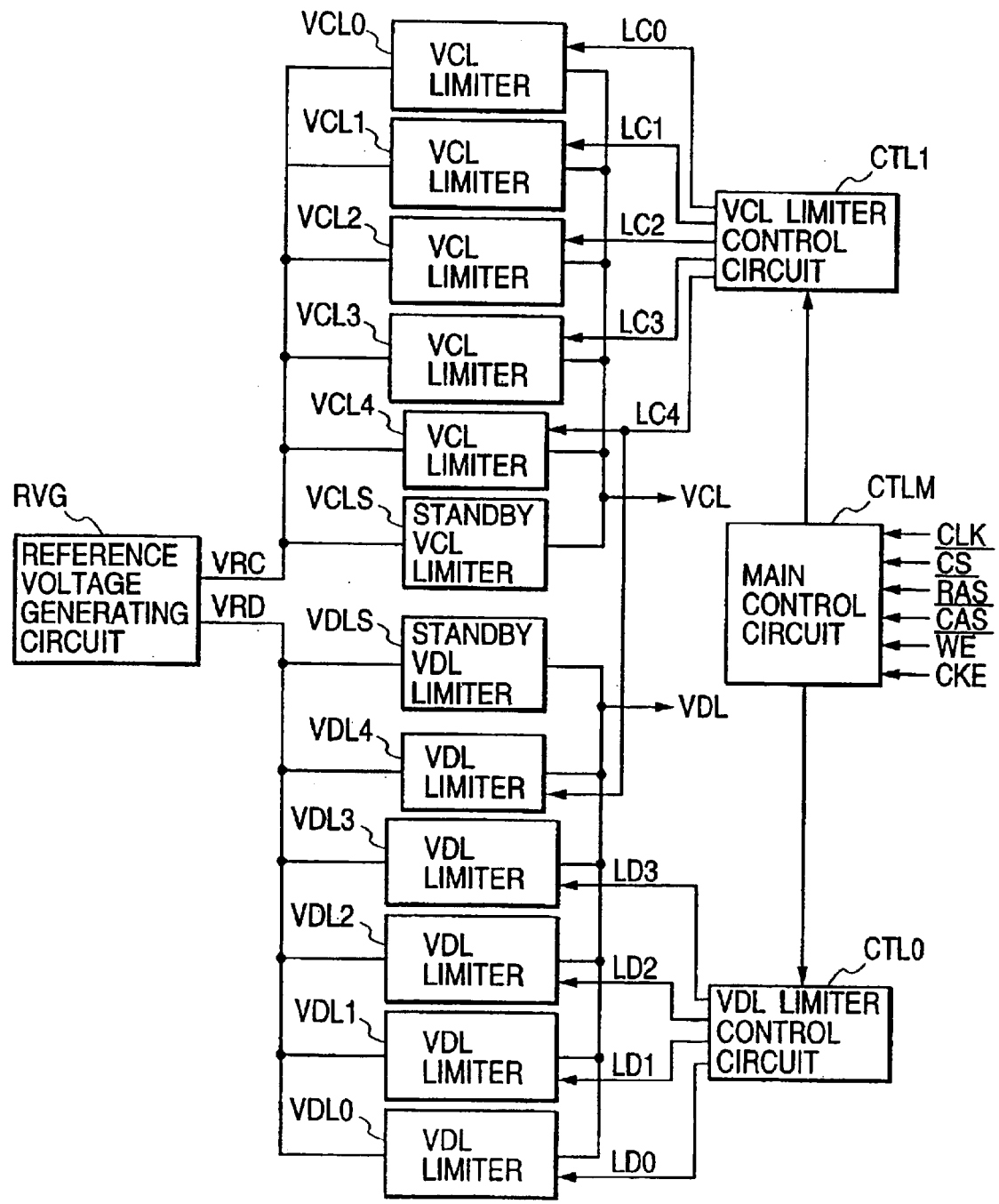
FIG. 23 is a block diagram of power supply circuits in the synchronous DRAM of FIG. 22.

FIG. 22 is a schematic view of a synchronous DRAM practiced as the fourth embodiment of this invention. The fourth embodiment is characterized in that the control scheme for VDL voltage limiter circuits (typical of the third embodiment) is applied to VCL voltage limiter circuits. Each of VCL voltage limiter circuits VCL0 through VCL3 in the fourth embodiment is located near a corresponding bank. In the middle of the configured banks are a voltage limiter circuit VCL4 and a standby voltage limiter circuit VCLS. FIG. 23 shows connecting relations between the component circuits of the fourth embodiment. As in the case of the third embodiment (FIG. 19), VDL voltage limiter circuits VDL0 through VDL4 are controlled by active signals LD0, LD1, LD2, LD3 and LC4 respectively. The VCL voltage limiter circuits VCL0 through VCL4 are controlled by active signals LC0, LC1, LC2, LC3 and LC4 respectively.

Figure 24:
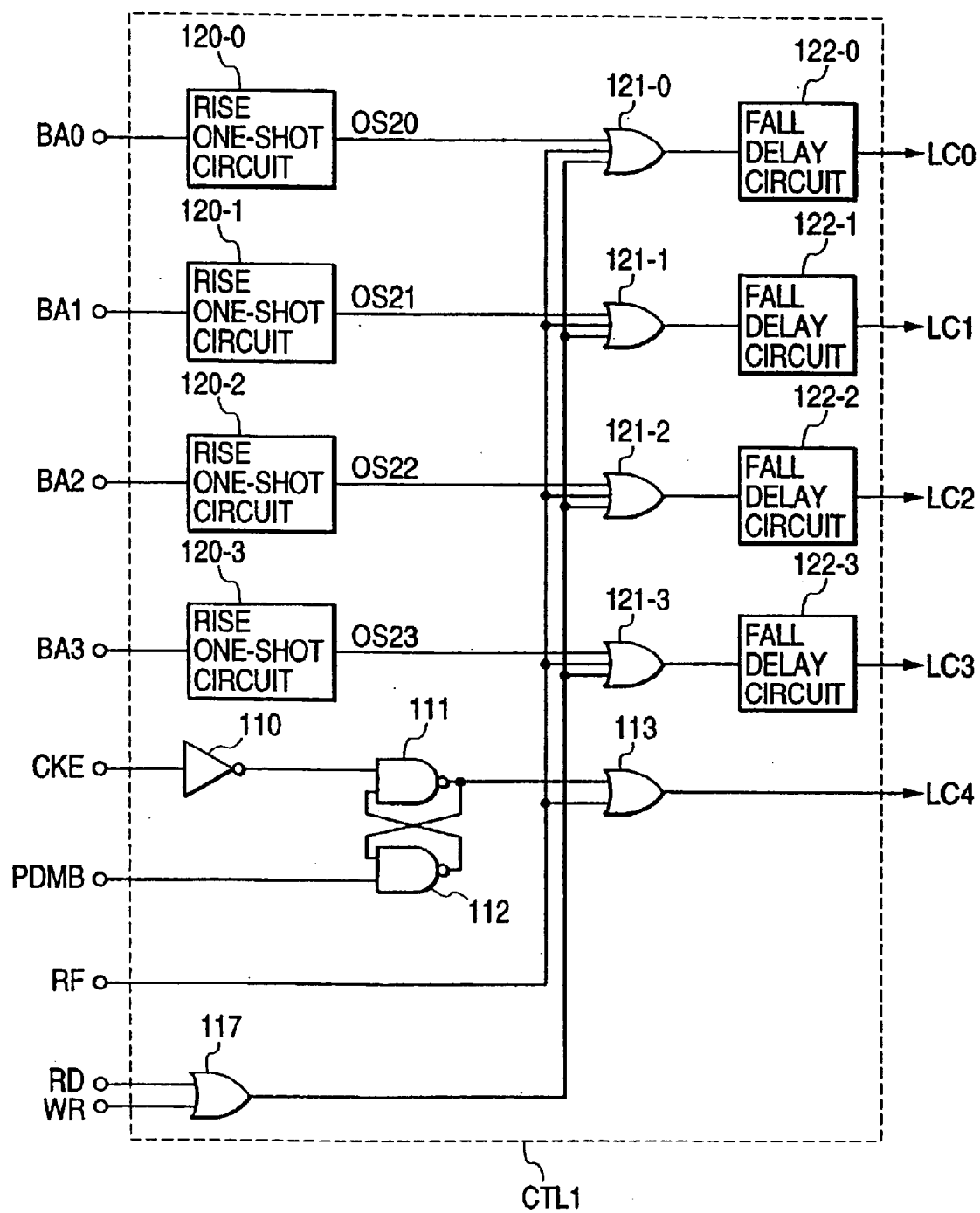
FIG. 24 is a circuit diagram of a voltage limiter control circuit CTL1 in the synchronous DRAM of FIG. 22.
Figure 25:
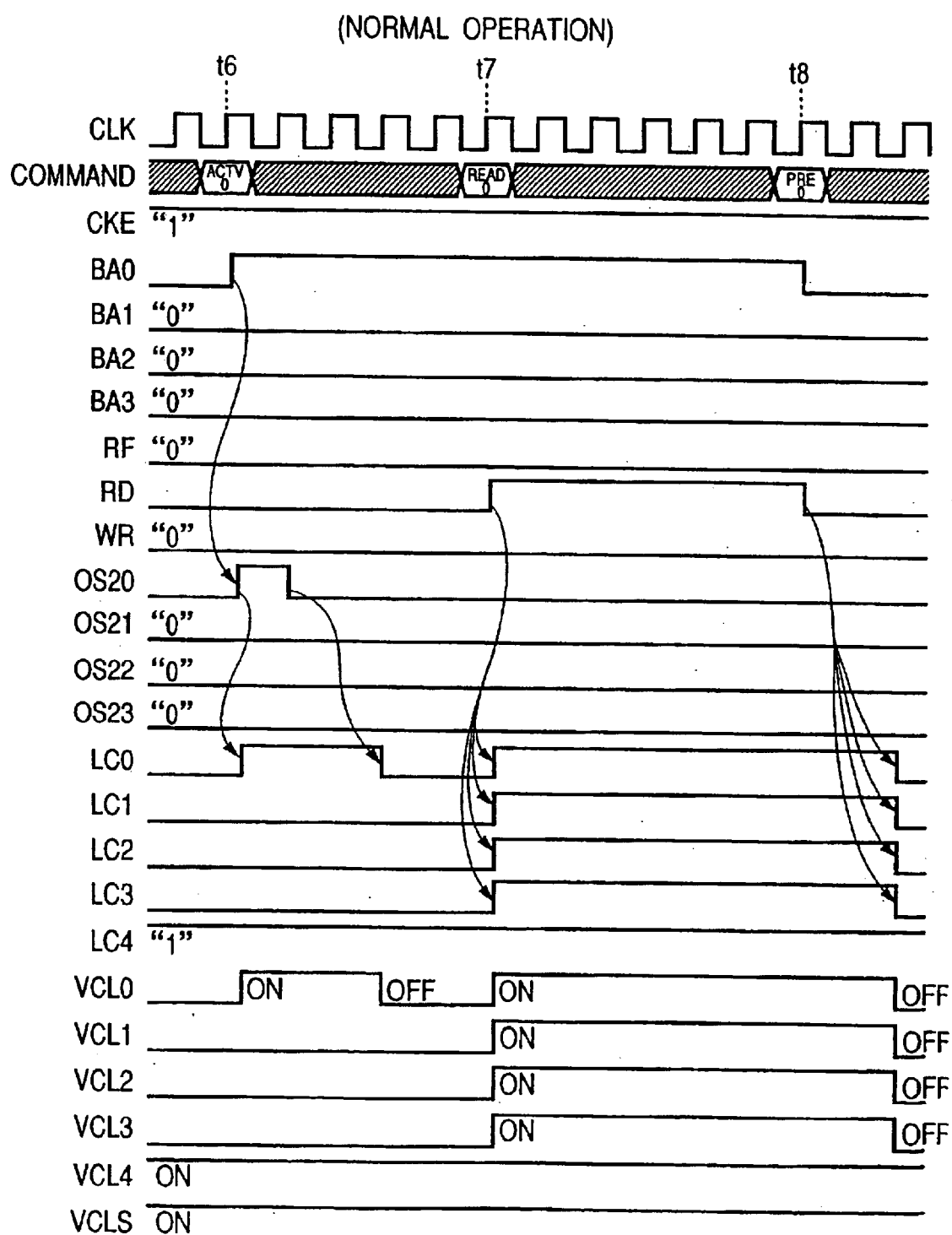
FIG. 25 is an operation waveform chart applicable to the control circuit in FIG. 24.

The control circuit CTL0 is the same in structure as that of the third embodiment (FIG. 20). Thus no further description will be made of that circuit. The control circuit CTL1 is described below with reference to the circuit diagram of FIG. 24 and the operation waveform chart of FIG. 25. As in the case of FIG. 9, the setup of FIG. 24 has a bank 0 activated and has data read therefrom. An active command to activate the bank 0 is input at time t6, which sets a signal BA0 to "1." This causes an output OS20 of a one-shot pulse generating circuit 120-0 to become "1" for a predetermined period of time. The output OS20 being "1" causes the output signal LC0 to reach "1" and then to return to "0" with a predetermined delay caused by a delay circuit 122-0. At time t7 when a read command to read data from the bank 0 is input, the read mode is selected in which the signal RD is set to "1" and all output signals LC0 through LC3 are also set to "1." At time t8 when a precharge command (PRE 0) to precharge the bank 0 is input, the signal RD is brought to "0" and, a little later, the signals LC0 through LC3 are also brought to "0." The output signal LC4 is always at "1" because the clock enable signal CKE is set to "1."

As a consequence, the voltage limiter circuits VCL0, VCL4 and VCLS are turned on immediately after the input of a bank active command. In the read mode, the circuits VCL0 through VCL4 and VCLS are all turned on; otherwise the circuits VCL4 and VCLS alone are activated. Because a large current flows immediately after the input of the bank active command or when a read mode is in effect, the number of activated voltage limiter circuits is increased during such periods in order to provide a large current. At other times, the current flow is small, so that the number of active voltage limiter circuits may be reduced accordingly. Under such a control scheme, only the voltage limiter circuits VCL4 and VCLS are turned on in the active standby mode (from bank activation until the issue of a read command). Compared with conventional setups where all voltage limiter circuits are activated during operation, the power dissipation in the active standby mode is thus reduced considerably.

As is clear from the foregoing explanation, the power supplying capability of the voltage limiter circuit VCL4 is allowed to be smaller than that of the circuit VCL0, VCL1, VCL2 or VCL3 but should preferably be larger than that of the circuit VCLS. That is because a small portion of the circuits (e.g., input buffers for clock signal CLK) are operating even in the active standby mode. Controlled by the active signal LC4, the circuit VCL4 is turned off in a power-down mode or in a self-refresh mode (see FIGS. 11 and 12).

Whereas the description above has focused on read operations, the description also applies to write operations taking place in the same manner except that the signal WR instead of the signal RD is set to "1." In write operations, the active standby current may be reduced in a like manner.

With the fourth embodiment, the minimum number of VDL or VCL voltage limiter circuits configured (excluding standby voltage limiter circuits) need only be made equal to the number of the banks being used plus 1. That is, there should be one circuit corresponding to each bank and at least one circuit controlled by the signal LC4.

Fifth Embodiment

Figure 26:
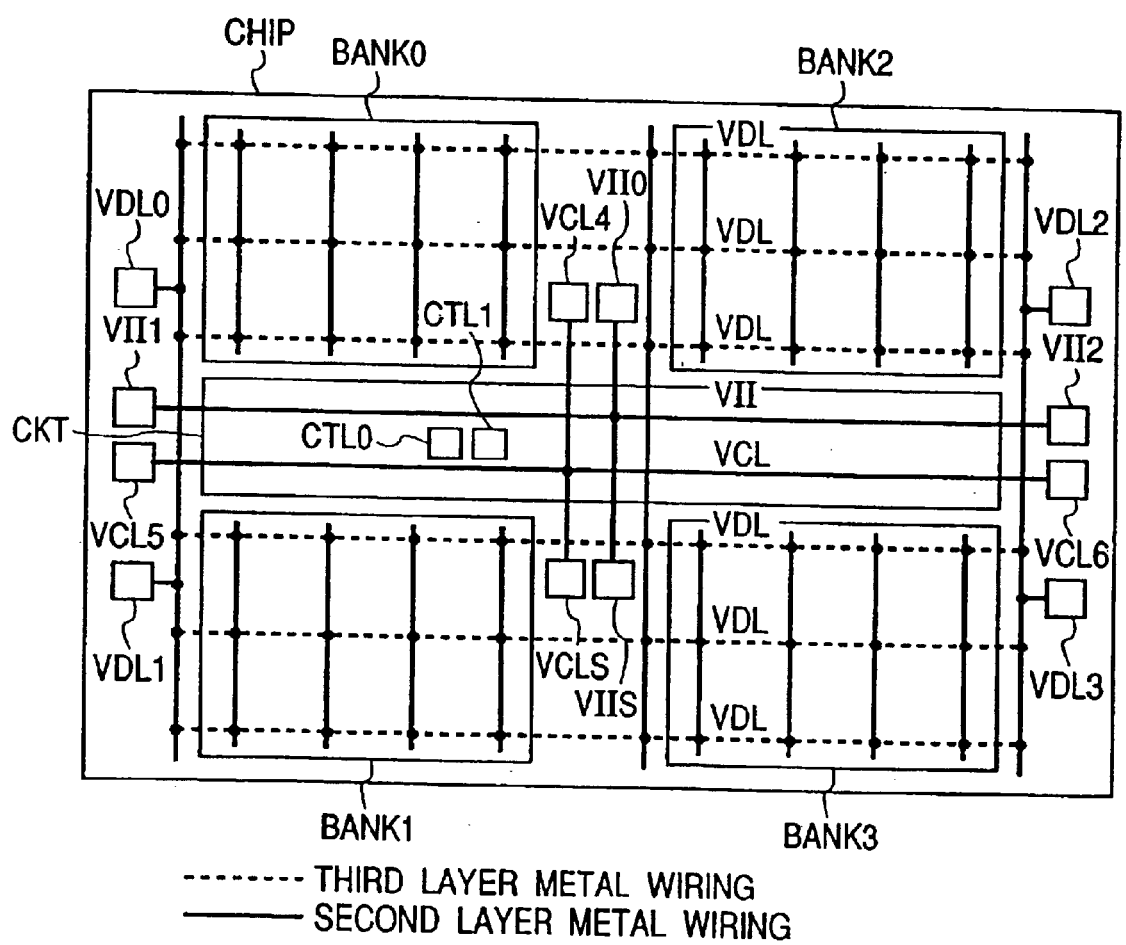
FIG. 26 is a schematic view of a synchronous DRAM practiced as a fifth embodiment of this invention.

FIG. 26 is a schematic view of a synchronous DRAM practiced as the fifth embodiment of this invention. The difference between the circuit of FIG. 26 and that of FIG. 1 is that the setup of FIG. 26 has an internal supply voltage VII generated for dedicated use by internal buffers and that an internal supply voltage VDL for memory arrays is equal in level to an internal supply voltage VCL for peripheral circuits. Illustratively, the voltages are at the following levels: VDD=3.3 V, VCL=VDL=1.8 V and VII=2.5 V. The input buffers need to have a stable supply voltage because they are required to meet the specifications of the high level VIH and low level VIL regarding input signals. For that reason, a supply voltage dedicated to the input buffers is generated in a stable manner by voltage limiter circuits VII0 through VII2 and VIIS. Since the input buffers are included in the peripheral circuits CKT as mentioned earlier, the VII line passes through the circuits CKT.

Figure 27:
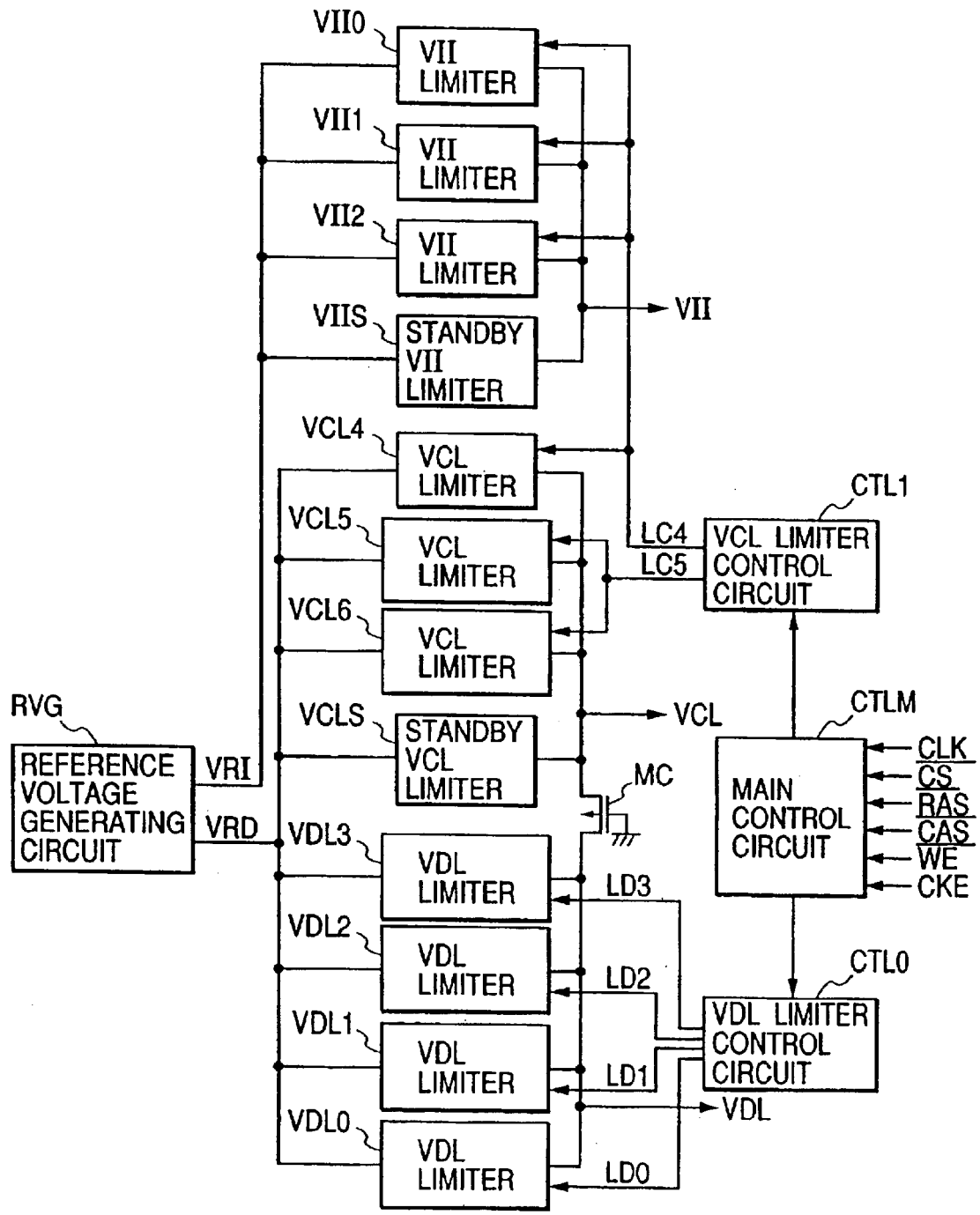
FIG. 27 is a block diagram of power supply circuits in the synchronous DRAM of FIG. 26.

FIG. 27 shows connecting relations between the component circuits of the fifth embodiment. Because the circuit constitution of the fifth embodiment is roughly the same as that of the first embodiment (in FIG. 4), the only differences therebetween are described below. The fifth embodiment has the voltage limiter circuits VII0 through VII2 and VIIS added in order to generate the internal supply voltage VII. These circuits generate the voltage VII by referring to a reference voltage VRI generated by a reference voltage generating circuit RVG (not shown in FIG. 26). The circuit VIIS is a circuit which is continuously active and which provides a small current supplying capability while consuming a limited amount of power. The circuits VII0 through VII2 provide a large current supplying capability while dissipating a relatively large amount of power, and are turned on and off by an active signal LC4. As such, the circuits VII0 through VII2 are always active except in a power-down mode or in a self-refresh mode.

Because the level of the internal supply voltage VDL is equal to that of the internal supply voltage VCL, the VDL and VCL voltage limiter circuits make use of a common reference voltage VRC. There is no standby VDL voltage limiter circuit VDLS. Instead, the VDL and VCL voltage limiter circuits are connected by means of a suitable resistor (MOS transistor MC in the case of FIG. 27); Where all banks are inactive, the voltage limiter circuits VDL0 through VDL3 are turned off. At that point, the VDL level is retained by the VCL voltage limiter circuits through the transistor MC. In this manner, where the VDL level is equal to the VCL level, the circuit VDLS may be omitted. The absence of the circuit contributes to a corresponding reduction in power dissipation in a power-down mode or in a self-refresh mode.

With the fifth embodiment, the number of VDL voltage limiter circuits and that of VCL voltage limiter circuits (excluding standby voltage limiter circuits) may be determined in the same manner as with the first embodiment. Although the fifth embodiment incorporates three VII voltage limiter circuits (excluding standby voltage limiter circuits), this is not limitative of the invention. There need only be a minimum of one VII voltage limiter circuit. As described, the fifth embodiment is characterized by the absence of a standby VDL voltage limiter circuit.

Although the invention has been shown as being applied to synchronous DRAMs, this is not limitative of the invention. The invention may also be applied to semiconductor memories such as DDR (double data rate) SDRAMs, Synclink-DRAMs and Rambus-DRAMs which have a plurality of banks each and whose operations are designated by commands regardless of specific command formats. It is also possible to apply the invention to a single-chip semiconductor device comprising a similar DRAM, logic circuits, a CPU and other elements in a mixed fashion. The invention is particularly advantageous when applied to a semiconductor device with a memory having data read into its sense amplifiers and latched therein, as in the case of the active standby mode for SDRAMs.

Although the description above has largely focused on memory banks of the synchronous SDRAM, this is not limitative of the invention. The invention may also be applied to memory arrays (memory blocks) of DRAMs, SRAMs and other memories, as well as to logical function-equipped memories including DRAMs, SRAMs and other memories.

The voltage limiter circuits discussed above may be replaced by various voltage generating circuits for generating a boosted voltage (Vpp), a substrate voltage (Vbb) and a plate voltage (Vp1). The power dissipation of these voltage generating circuits is reduced when the operating status of the voltage generating circuits (including a boosted voltage generator, a substrate voltage generator, a plate voltage generator) is controlled suitably corresponding to the operating state of the memory arrays (memory blocks, banks, etc.) of memories such as SDRAMs, DRAMs and SRAMs.

Thus, as described, on-chip voltage limiter circuits in the activate standby mode may have their power dissipation reduced according to the invention.

While preferred embodiments of the invention have been described using specific terms, such description is for illustrative purposes only, and it is to be understood that changes and variations may be made without departing from the spirit or scope of the claims that follow.

What is claimed is:

1. A synchronous DRAM comprising:
   a first input terminal which receives an external clock signal;
   a second input terminal which receives a clock enable signal;
   a plurality of third input terminals which receive command signals;
   a fourth input terminal which receives an external power supply voltage; and
   a voltage limiter circuit which generates an internal power supply voltage lower than said external power supply voltage; and
   a control circuit which receives said command signals in synchronism with said external clock signal,
   wherein said DRAM is in a power down mode when said clock enable signal is low,
   wherein said DRAM is out of said power down mode when said clock enable signal is high,
   wherein said voltage limiter circuit is not in operation when said DRAM is in said power down mode,
   wherein said voltage limiter circuit is in operation when said DRAM is out of said power down mode, and
   wherein said voltage limiter circuit starts operating in synchronism with a rising edge of said clock enable signal.

2. A synchronous DRAM according to claim 1,
   wherein said voltage limiter circuit stops operating in synchronism with receiving a set of command signals.

3. A synchronous DRAM comprising:
   a first power supply circuit which receives an externally supplied voltage and outputs an internal supply voltage; and
   a second power supply circuit which receives said externally supplied voltage and outputs said internal supply voltage,
   wherein said first power supply circuit is not in operation when a semiconductor device is in a power down mode for said synchronous DRAM,
   wherein said second power supply circuit is continuously in operation during said power down mode,
   wherein a voltage limiter in said first power supply circuit starts operating in synchronism with a clock enable signal applied to said synchronous DRAM prior to receipt of a power down mode end command by said synchronous DRAM.

4. A synchronous DRAM comprising:
   a first power supply circuit which receives an externally supplied voltage and outputs an internal supply voltage; and
   a second power supply circuit which receives said externally supplied voltage and outputs said internal supply voltage, wherein said synchronous DRAM operates in a power down mode and a mode, prior to said power down mode, in which said synchronous DRAM receives a clock signal and stands by for a power down mode command signal to begin said power down mode, and means for turning on a voltage limiter in one of said first or second power supply circuits prior to receipt of a power down mode end command being applied to the synchronous DRAM, wherein said first power supply circuit is not in operation when said semiconductor device is in said power down mode, and wherein said second power supply circuit is continuously in operation during said power down mode.

5. A synchronous DRAM according to claim 1, wherein said rising edge of said clock enable signal is prior to a rising edge of the external clock signal which terminates the power down mode.

6. A synchronous DRAM comprising:

a first input terminal which receives an external clock signal;

a second input terminal which receives a clock enable signal;

a plurality of third input terminals which receive command signals;

a fourth input terminal which receives an external power supply voltage; and a voltage limiter circuit which generates an internal power supply voltage lower than said external power supply voltage; and a control circuit which receives said command signals in synchronism with said external clock signal, wherein said DRAM is in a power down mode when said clock enable signal is low, wherein said DRAM is out of said power down mode when said clock enable signal is high, wherein said voltage limiter circuit is not in operation when said DRAM is in said power down mode, wherein said voltage limiter circuit is in operation when said DRAM is out of said power down mode, and means for turning on the voltage limiter circuit earlier than receipt of a power down mode end command being received by the control circuit.

7. A synchronous DRAM according to claim 1, wherein said means includes means for starting operation of the voltage limiter circuit in synchronization with a rising edge of the clock enable signal.

8. A synchronous DRAM according to claim 7, wherein said rising edge of said clock enable signal is prior to a rising edge of the external clock signal which terminates the power down mode.

* * * * *